(12) United States Patent
Lunsman et al.

(10) Patent No.: US 11,579,668 B2
(45) Date of Patent: Feb. 14, 2023

(54) MULTIPOINT CONTACT CONDUCTION COOLING OF A REMOVABLE DEVICE

(71) Applicant: HEWLETT PACKARD ENTERPRISE DEVELOPMENT LP, Houston, TX (US)

(72) Inventors: Harvey J. Lunsman, Chippewa Falls, WI (US); Steven Dean, Chippewa Falls, WI (US); John Franz, Houston, TX (US); Brady Dulian, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 293 days.

(21) Appl. No.: 17/030,677

(22) Filed: Sep. 24, 2020

(65) Prior Publication Data
US 2022/0091642 A1 Mar. 24, 2022

(51) Int. Cl.
*G06F 1/18* (2006.01)
*H05K 1/14* (2006.01)
*H05K 7/10* (2006.01)

(52) U.S. Cl.
CPC ............ *G06F 1/183* (2013.01); *H05K 1/141* (2013.01); *H05K 7/10* (2013.01); *H05K 2201/10325* (2013.01); *H05K 2201/10598* (2013.01)

(58) Field of Classification Search
None
See application file for complete search history.

(56) References Cited

U.S. PATENT DOCUMENTS

| | | |
|---|---|---|
| 6,255,136 B1 | 7/2001 | Alcoe et al. |
| 6,307,748 B1 | 10/2001 | Lin et al. |
| 6,819,562 B2 | 11/2004 | Boudreaux et al. |
| 6,867,975 B2 | 3/2005 | Kashiwagi |
| 7,167,379 B2 | 1/2007 | DiBene et al. |
| 7,317,618 B2 | 1/2008 | Robinson et al. |
| 7,573,709 B2 | 8/2009 | Gilliland et al. |

(Continued)

OTHER PUBLICATIONS

Alpha Novatech, Inc., "Z-Shape Clip and Anchor," 2007, https://www.alphanovatech.com/en/c_zclipe.html.

(Continued)

*Primary Examiner* — James Wu
*Assistant Examiner* — Christopher L Augustin
(74) *Attorney, Agent, or Firm* — Hewlett Packard Enterprise Patent Department

(57) ABSTRACT

Example implementations relate to a host device and a method for thermal management of a removable device, such as a pluggable electronic transceiver comprising a plurality of spring fingers that provide multipoint contact conduction cooling of the removable device. The host device includes a host circuit board having a connector, and a thermal management unit having a cooling component and the plurality of spring fingers. The cooling component is coupled to a portion of the host circuit board and includes a partially protruded portion. Each of the plurality of spring fingers includes a first end coupled to the partially protruded portion, and a second end having a dry contact surface to establish a direct thermal interface with a peripheral surface of the removable device to allow waste-heat to transfer from the removable device to the cooling component through each spring finger.

20 Claims, 11 Drawing Sheets

(56) References Cited

U.S. PATENT DOCUMENTS

| | | | |
|---|---|---|---|
| 9,531,117 B1* | 12/2016 | Yang | H01R 13/506 |
| 2004/0102062 A1* | 5/2004 | Liao | H05K 7/1069 |
| | | | 439/66 |
| 2005/0225945 A1 | 10/2005 | Liu | |
| 2013/0157499 A1* | 6/2013 | Crippen | H01R 12/724 |
| | | | 439/487 |
| 2013/0164970 A1* | 6/2013 | Regnier | F28F 3/02 |
| | | | 165/185 |
| 2015/0029667 A1* | 1/2015 | Szczesny | G02B 6/4261 |
| | | | 361/700 |
| 2016/0093996 A1* | 3/2016 | Phillips | H05K 7/20418 |
| | | | 439/487 |
| 2017/0164518 A1* | 6/2017 | Morgan | G02B 6/43 |
| 2020/0153163 A1* | 5/2020 | Guetig | H01R 13/5205 |
| 2020/0257067 A1* | 8/2020 | Meunier | G02B 6/4284 |

OTHER PUBLICATIONS

Neoconix™, "PCBeam™ Technology", available online at <https://neoconix.com/pcbeam/>, 2019, 3 pages.

\* cited by examiner

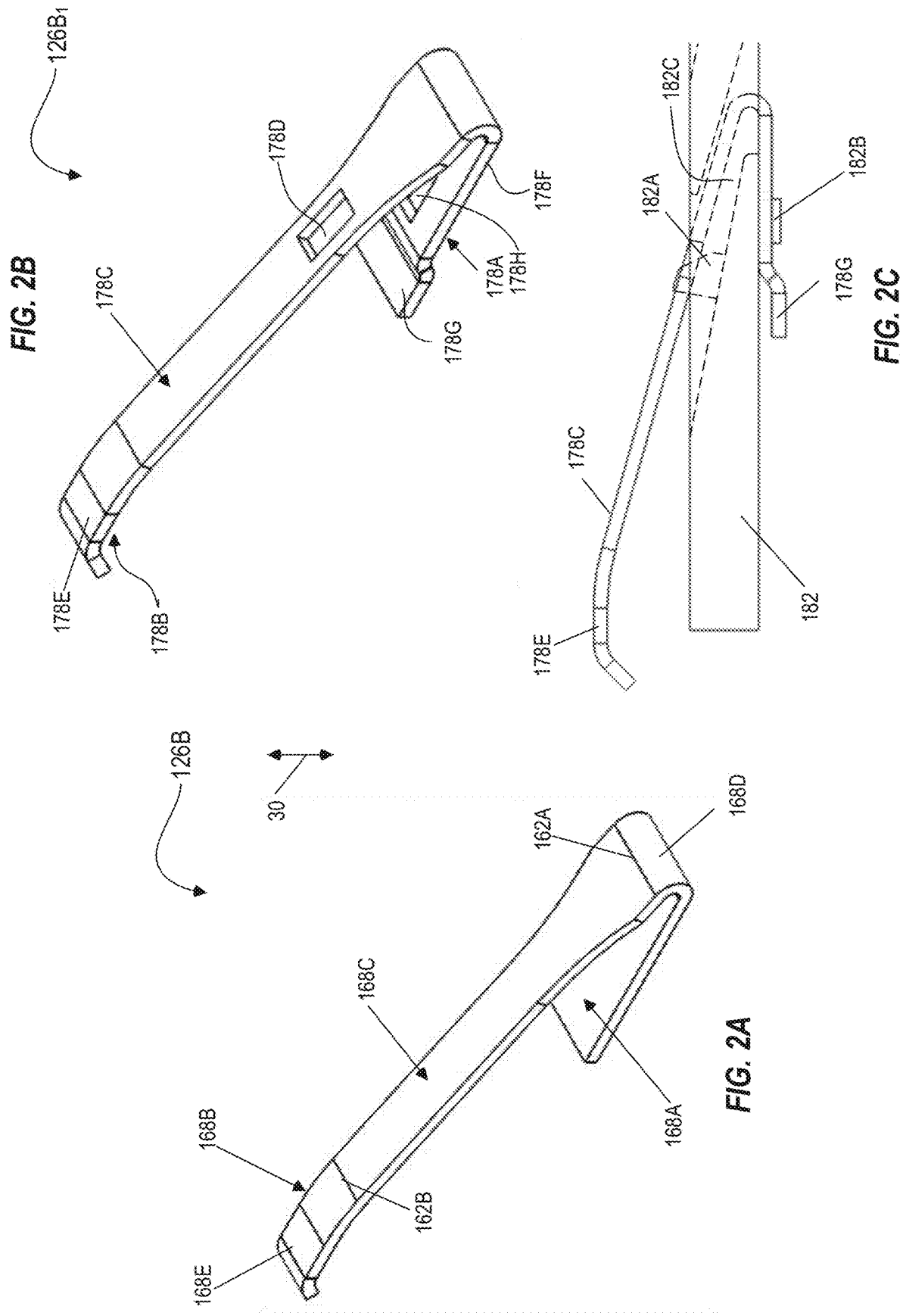

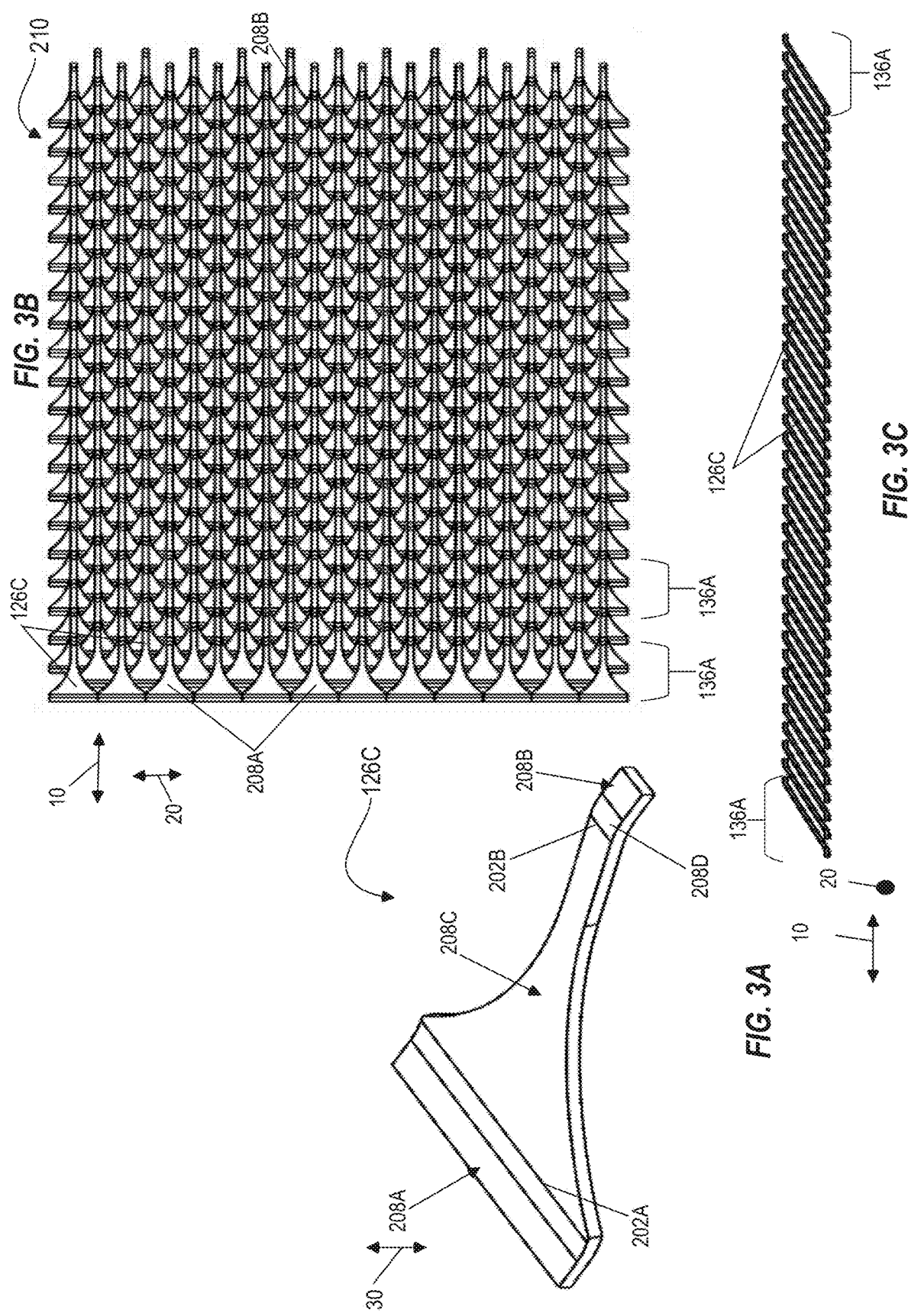

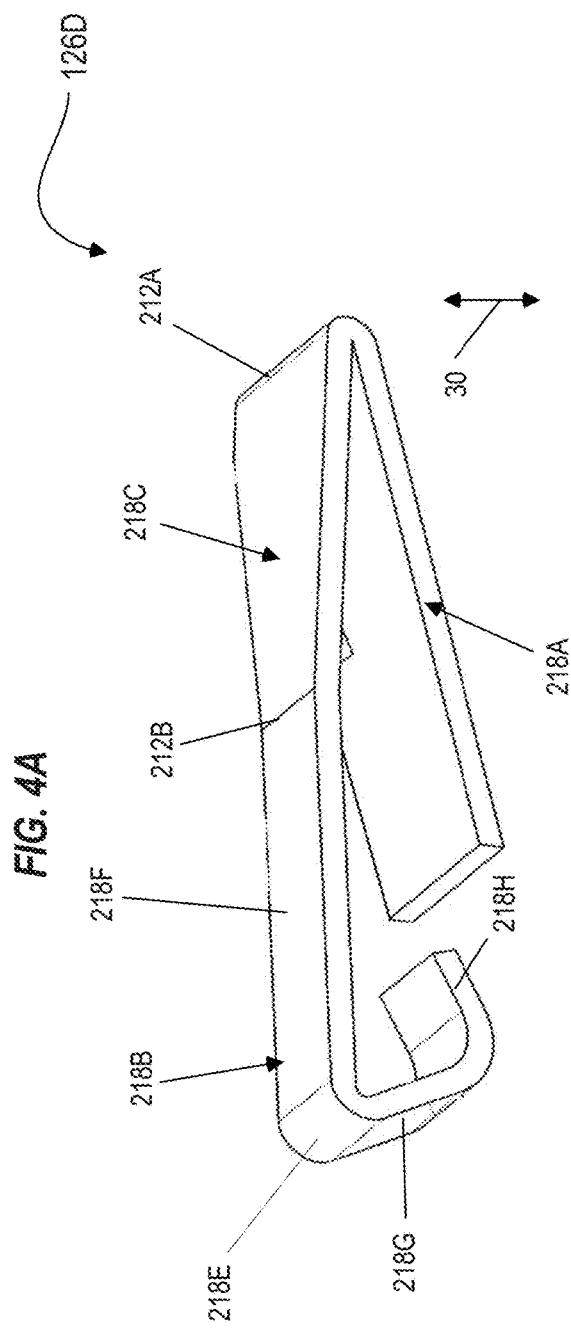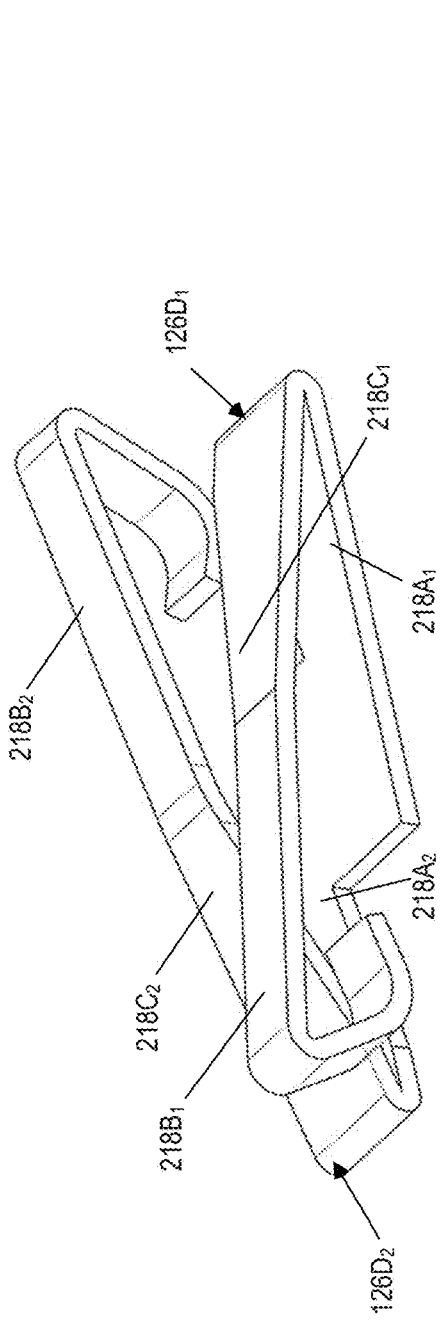

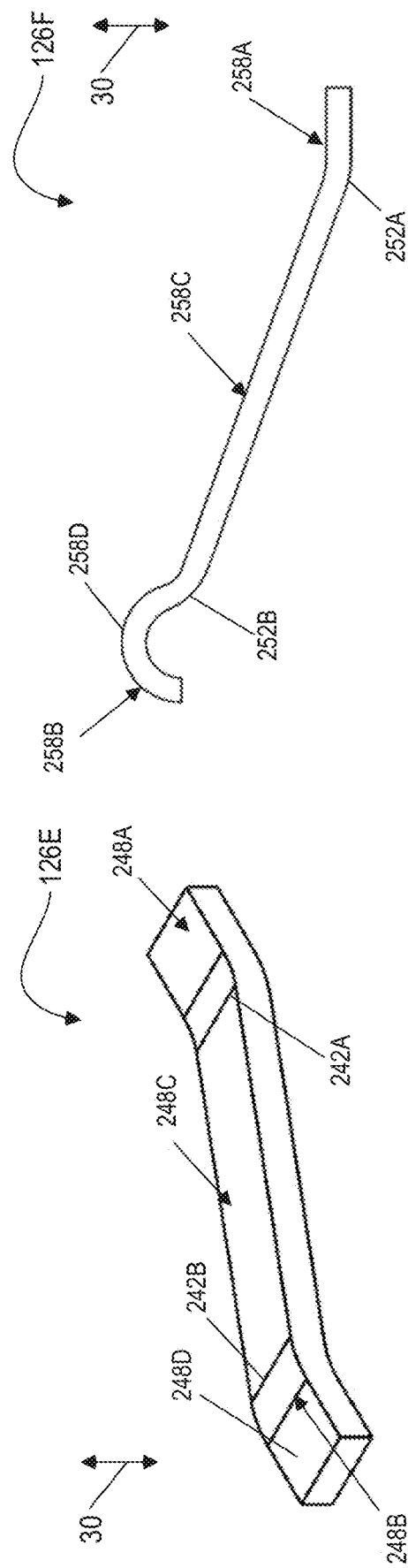

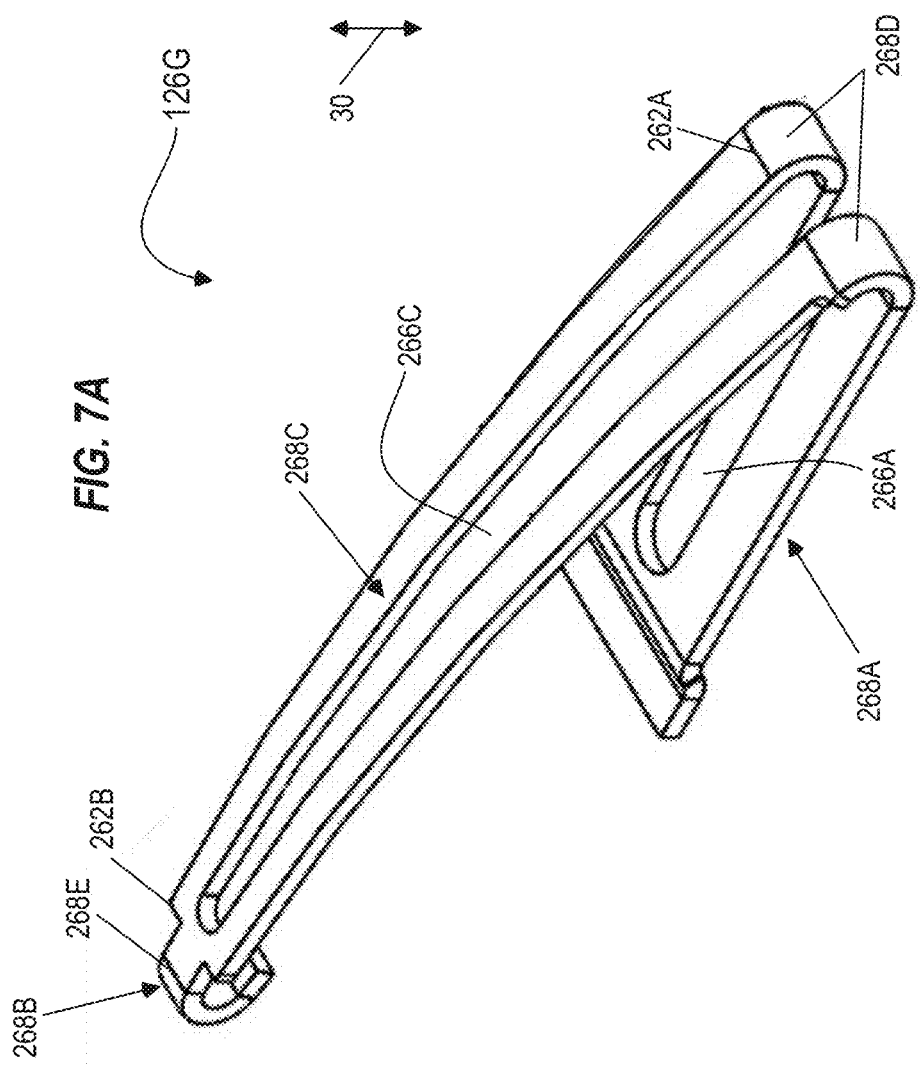

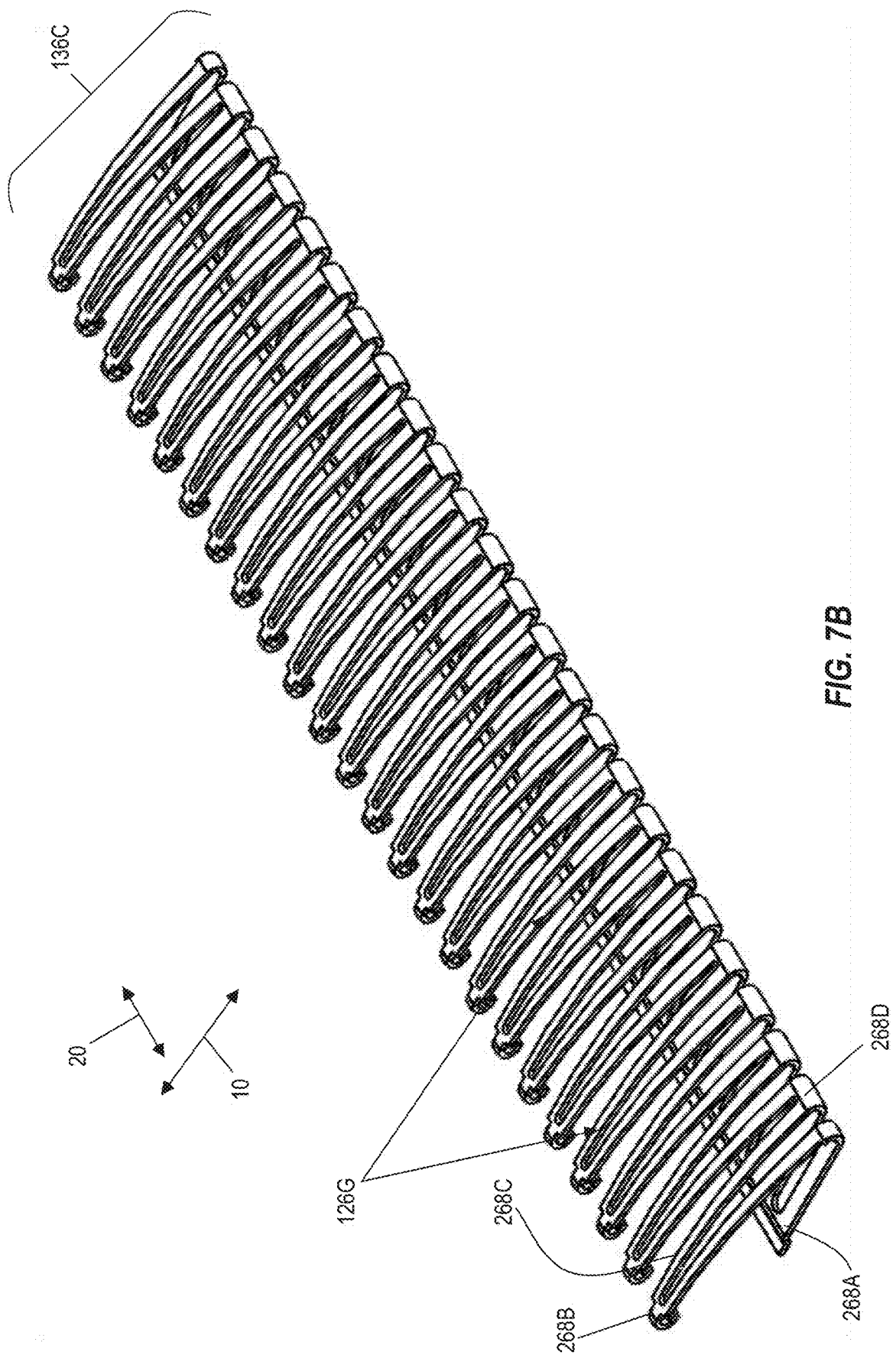

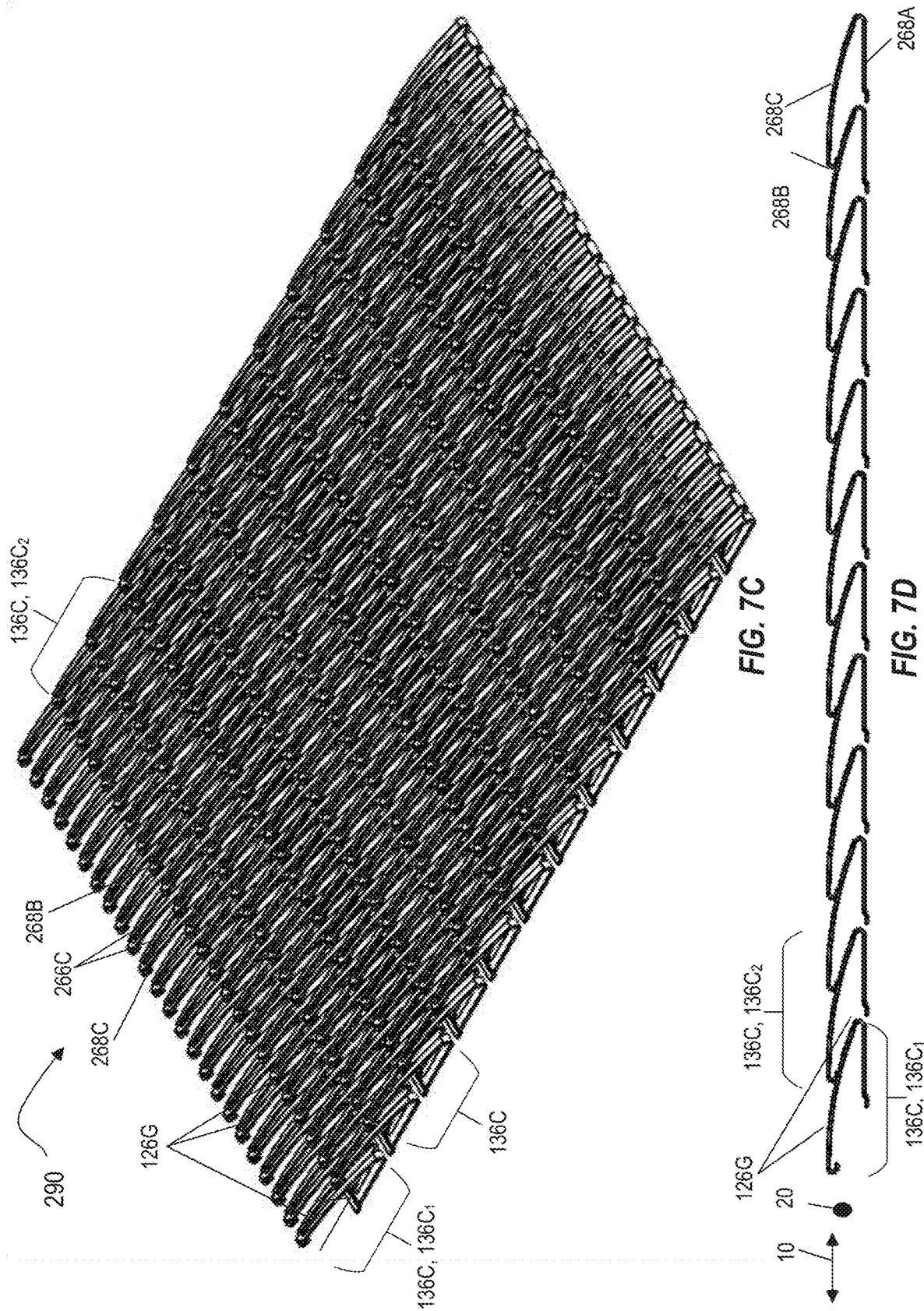

MULTIPOINT CONTACT CONDUCTION COOLING OF A REMOVABLE DEVICE

BACKGROUND

A removable device, such as a small form-factor pluggable (SFP) transceiver device or a non-volatile memory express (NVMe) storage drive may consume a greater amount of power, while performing its respective functions, such as transmitting data, receiving data, processing data, storing data, or the like. Thus, the removable device may generate excessive waste-heat, while performing its respective functions. If adequate amount of the waste-heat is not dissipated from the removable device, it may exceed thermal specifications of the removable device, and thereby degrade the performance, reliability, life expectancy of the removable device, and may also cause its failure. Accordingly, one or more heat sinks may be used to regulate the waste-heat in the removable device.

BRIEF DESCRIPTION OF THE DRAWINGS

Various examples will be described below with reference to the following figures.

FIG. 2A illustrates a perspective view of a spring finger having a rotated "J" shaped geometry according to an example implementation of the present disclosure.

FIG. 2B illustrates a perspective view of another spring finger having a rotated "J" shaped geometry according to an example implementation of the present disclosure.

FIG. 2C illustrates a schematic diagram of the spring finger having the rotated "J" shaped geometry of FIG. 2B and a retainer element according to an example implementation of the present disclosure.

FIG. 3A illustrates a perspective view of a spring finger having a spatula shaped geometry according to an example implementation of the present disclosure.

FIG. 3B illustrates a bottom view of an array of spring fingers having a spatula shaped geometry according to an example implementation of the present disclosure.

FIG. 3C illustrates a side view of a plurality of spring fingers having a spatula shaped geometry according to an example implementation of the present disclosure.

FIG. 4A illustrates a perspective view of a spring finger having a loopback shaped geometry according to an example implementation of the present disclosure.

FIG. 4B illustrates a perspective view of a plurality of spring fingers having a loopback shaped geometry according to an example implementation of the present disclosure.

FIG. 5 illustrates a perspective view of a spring finger having a cantilever shaped geometry according to an example implementation of the present disclosure.

FIG. 6 illustrates a schematic diagram of a spring finger having a mirrored "S" shaped geometry according to an example implementation of the present disclosure.

FIG. 7A illustrates a perspective view of a spring finger having a twin rotated "J" shaped geometry according to an example implementation of the present disclosure.

FIG. 7B illustrates a perspective view of a strip of a plurality of spring fingers having a twin rotated "J" shaped geometry according to an example implementation of the present disclosure.

FIG. 7C illustrates a bottom view of an array of spring fingers having a twin rotated "J" shaped geometry according to an example implementation of the present disclosure.

FIG. 7D illustrates a side view of a plurality of spring fingers having a twin rotated "J" shaped geometry according to an example implementation of the present disclosure.

DETAILED DESCRIPTION

Figure 1A:
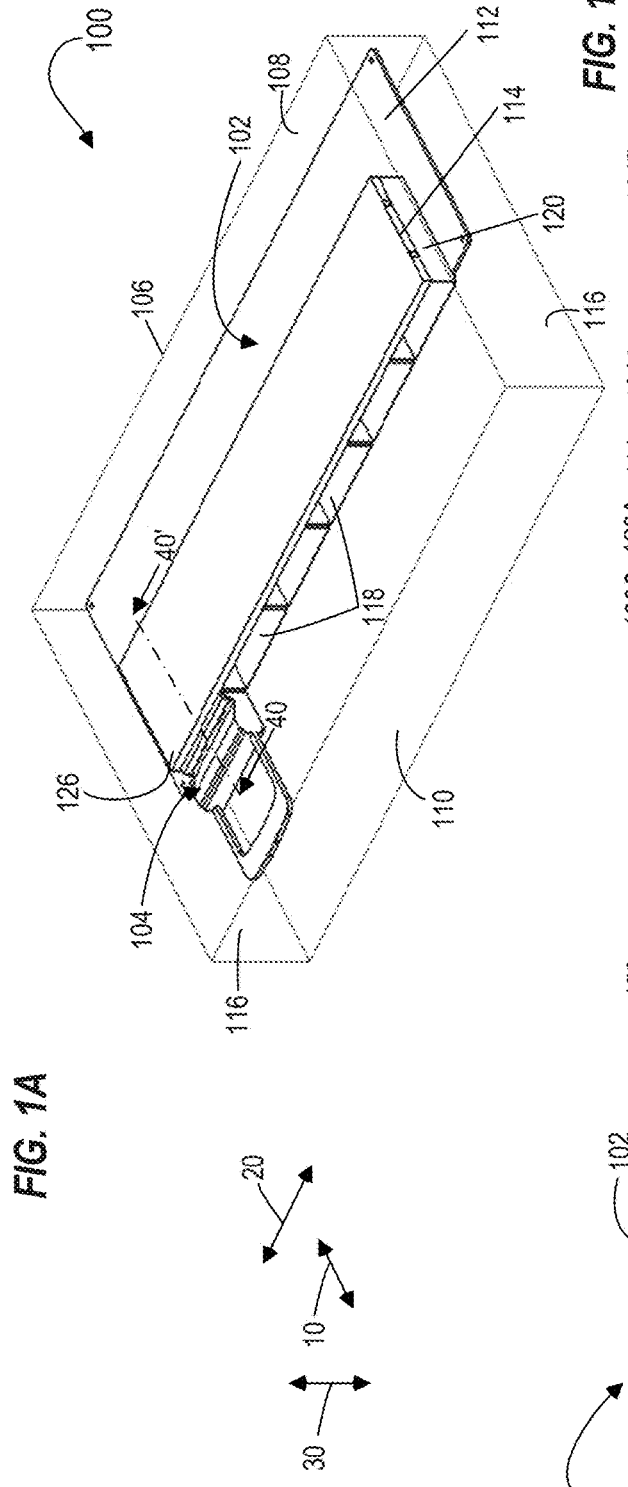
FIG. 1A illustrates a perspective view of an electronic system having a host device and a removable device according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "host device" may refer to a type of a computing device, such as a server device, a storage device, a power conversion device, or a networking device, having a connector or a modular port to receive a removable device. As used herein, the term "removable device" may refer to a type of pluggable electronic device, which is not native to the host device, or which is ancillary to the host device, and may have to be attached by way of plugging into the modular port of the host device, to transmit, receive, store, or process data. For example, the removable device may be a pluggable transceiver device or a pluggable storage drive, or the like. The term "modular port" may refer to a type of electronic connectors, which is native to the host device, or which is integral to the host device, and may provision the removable device to be attached to the host device. As used herein, the term "electronic system" may refer to a type of a compute infrastructure, where the removable device and the host device may function as a plug and a socket of the compute infrastructure. Further, the term "plugging" may refer to fitting the removable device into the modular port of the host device by way of inserting or sliding a socket of the removable device into the modular port of the host device. Further, as used herein, the term "direct thermal interface" may refer to surfaces of two components, which are in direct contact with one another to form the interface there between, to allow a waste-heat transfer directly between the two components. For example, the direct thermal interface may be formed by the direct contact of a dry contact surface of each spring finger with a portion of a peripheral surface of the removable device, in which there is no intermediary component (i.e., gap pad, grease, foam, or the like) in-between those two surfaces. The term "dry contact surface" may refer to a surface area of each spring finger, which is configured to contact a mutually opposite surface (mating surface) of another component, for example, the portion of the peripheral surface to directly transfer the waste-heat there between, without the presence of an intervening component. As used herein the term "cold plate" may refer to a type of thermal conductive component, which contains an internal tubing through which a liquid coolant is forced to absorb a waste-heat transferred to the component by a waste-heat producing component, for example, a circuit board of a removable device, or a plurality of electronic components mounted on the circuit board. In some examples, the cold plate may also be referred to as a liquid-cooled dissipater. Further, the term "heat sink" may refer to a type of a passive heat exchanger that transfers the waste-heat generated by the waste-heat producing component to a fluid medium, such as an air or a liquid coolant flowing over the heat sink. It may be noted herein: an object, device, or assembly (which may comprise multiple distinct bodies that are thermally coupled, and may include multiple different materials), is "thermally conductive" between two thermal interfaces if any one of the following is true: (i) a heat transfer coefficient between the thermal interfaces is between 40 $W \cdot m^{-2} \cdot K^{-1}$ to 100 $W \cdot m^{-2} \cdot K^{-1}$ at any temperature between 0° C. and 100° C., (ii) the object is continuous piece of a material that has a thermal conductivity (often denoted k, $\lambda$, or $\kappa$) between the two interfaces between 40 $W \cdot m^{-2} \cdot K^{-1}$ to 100 $W \cdot m^{-2} \cdot K^{-1}$ at any temperature between 0° C. and 100° C., or (iii) the object is a heat pipe, vapor chamber, continuous body of copper, or continuous body of aluminum. Examples of materials whose thermal conductivity is between 40 $W \cdot m^{-2} \cdot K^{-1}$ to 100 $W \cdot m^{-2} \cdot K^{-1}$ at any temperature between 0° C. and 100° C. include certain types of copper, aluminum, silver, and gold, for example.

The present disclosure describes example implementations of a host device and a method for thermal management of a removable device plugged into the host device. In one or more examples, the host device may be a computing device, such as a server device, a storage device, a power conversion device, or a networking device, having a modular connector. The removable device may be a pluggable electronic device, such as a small form-factor pluggable (SFP) transceiver coupled to an active optical cable (AOC), or a quad small form-factor pluggable transceiver coupled to an AOC, a non-volatile memory express (NVMe) storage drive, or the like. In some examples, the host device may include a connector or a modular port to receive the removable device, when plugged into the host device. For example, the connector may have a slot (or socket) to receive a plug having a portion of a circuit board of the removable device, and to communicatively couple the circuit board of the removable device to a host circuit board of the host device. In some examples, the connector or the modular port may be a networking device connector, a USB connector, a peripheral-component interconnect express (PCIe) connector, or the like. It may be noted herein that the terms "removable device", "removable electronic device", and "pluggable removable device" may be used interchangeably. Further, the terms "connector" and "modular port" may be used interchangeably.

During operation, the removable device may generate a considerable amount of waste-heat that needs to be removed in order to improve the performance, reliability, or life expectancy of the removable device. In accordance to one or more examples, the host device may include a cooling component having a partially protruded portion. In such examples, the cooling component may further have a plurality of spring fingers spaced apart from each other and coupled to an inner surface of the partially protruded portion. For example, each of the plurality of spring fingers may include a first end that is coupled to the inner surface of the partially protruded portion, and a second end having a dry contact surface. In one or more examples, the dry contact surface may establish a direct thermal interface with a portion of a peripheral surface of a removable device, when the removable device is plugged into the host device. In such examples, the waste-heat generated by the removable device may be transferred from the removable device to the cooling component through the direct thermal interface established between the peripheral surface and the dry contact surface, in order to regulate the waste-heat of the removable device. Thus, the plurality of spring fingers of the present disclosure provides a multipoint contact conduction cooling for an effective thermal management of the removable electronic device plugged into the host device.

Figure 8:
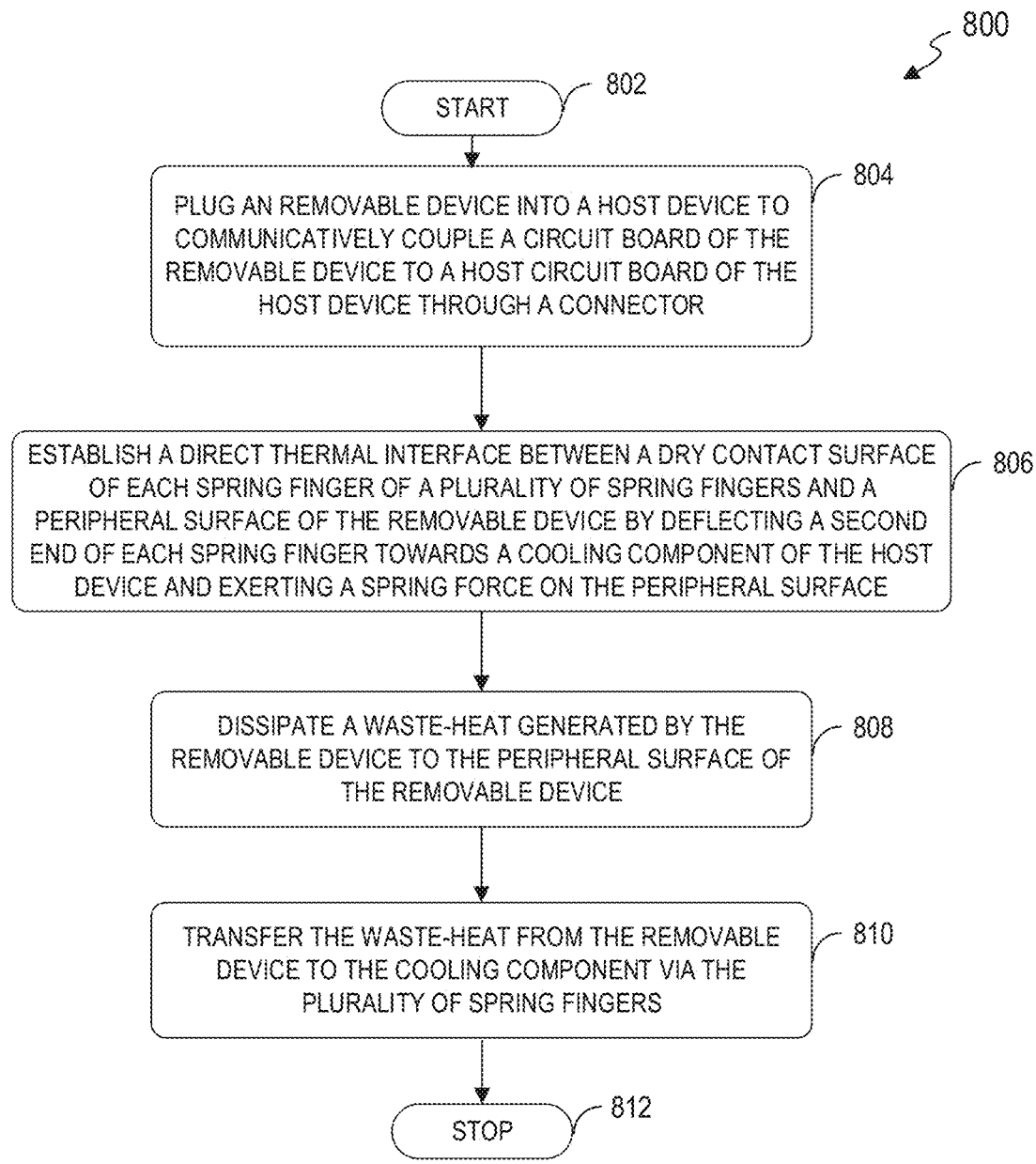
FIG. 8 illustrates a flowchart depicting a method of thermal management of a removable device according to an example implementation of the present disclosure.

For purposes of explanation, certain examples are described with reference to the components illustrated in FIGS. 1-8. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIG. 8 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A removable device, for example, a small form-factor pluggable (SFP) transceiver, a non-volatile memory express (NVMe) storage drive, or the like, is a compact and a hot-pluggable electronic device used to transfer, receive, process, or store data. In some examples, the transceiver when plugged into a host device, for example, a networking device may function as an intermediary component between a networking device connector, such as a switch, a router, a firewall, or a network card (or NIC), and an interconnecting cable, such as a copper cable or an optical fiber that is coupled to the transceiver. Typically, in such examples, the transceiver converts electrical signals into optical signals or vice versa for transmitting or receiving data through the interconnecting cable. The transceiver may consume a greater amount of power to convert the signals, and may thereby produce excessive waste-heat. In some other examples, the NVMe storage drive when plugged into the host device, for example, the storage device may function as the intermediary component between a peripheral-component interconnect express (PCIe) connector of the storage device and a cable connecting the NVMe storage drive. Typically, in such examples, the NVMe storage drive may consume a greater amount of power to process or store the data in the storage device, and may thereby produce excessive waste-heat.

In such examples, if the excessive waste-heat produced by the removable device is not adequately dissipated, it may degrade the removable device's performance, reliability, life expectancy and may also cause its failure. Accordingly, a heat sink that is thermally coupled to the removable device is used to dissipate the waste-heat from the removable device, and a cooling air passing over the heat sink is used to remove the waste-heat from the heat sink. However, when the removable device is plugged into the host device, the heat sink may not receive adequate supply of the cooling air to remove the waste-heat from the heat sink. Accordingly, the host device may provide a cooling component to remove the waste-heat from the heat sink. In such examples, the cooling component may establish a thermal interface (or thermal contact) with the heat sink to transfer the waste-heat from the heat sink to the cooling component for removing the waste-heat from the heat sink. However, maintaining the thermal contact between the cooling component and the heat sink (i.e., between two interfacing surfaces) may be difficult, as the interfacing surfaces may not be flat and/or smooth. Also, the accumulation of debris and/or surface imperfections (i.e., scratches, dents, or the like) may compromise the heat transfer between the interfacing surfaces. Further, it may be difficult to generate an optimal contact force/pressure to maintain the thermal contact or thermal interface between the interfacing surfaces.

In order to address the aforementioned issues, a thermal interface material (TIM), such as thermally conductive gap pads or thermal grease are used in-between the interfacing surfaces. However, repetitive plugging/unplugging of the removable device into the host device may result in peeling of the gap pads or may degrade the gap pads over a period of time. Similarly, repetitive plugging/unplugging of the removable device into the host device may make the thermal grease messy, easily scraped off from the host device, when the removable device is glided (slided) into the host device, or have to be replaced after every service event.

Further, the cooling component of the host device and/or the TIM may exert a contact force (or spring force), which may oppose an insertion force applied to plug the removable device into the host device or a removal force applied to unplug the removable device from the host device. In such examples, maintaining an optimal contact force, which is within acceptable safety limits to avoid repetitive force (e.g., insertion force or removal force) related injuries are extremely difficult.

A technical solution to the aforementioned problems may include providing a host device having a thermal management unit to regulate a waste-heat produced in a removable device. In one or more examples, the thermal management unit includes a plurality of spring fingers, where each spring finger has a first end coupled to a cooling component of the thermal management unit, and a second end having a dry contact surface. In such examples, the dry contact surface of each spring finger may independently establish a direct thermal interface with a portion of the peripheral surface of the removable device when plugged into the host device, so as to allow a multipoint contact conduction cooling of the removable device through the plurality of spring fingers. In some examples, each of the plurality of spring fingers is made of a thermal conductive material.

In one or more examples, each spring finger may apply an optimal contact force to allow easy plugging (e.g., inserting or sliding) of the removable device into the host device. For example, each spring finger may deflect marginally upwards towards the cooling component when the removable device is plugged into the host device. However, the optimal spring force exerted by each of the plurality of spring fingers may be sufficient to establish the direct thermal interface between the dry contact surface of each spring finger and the peripheral surface of the removable device. In other words, the plurality of spring fingers may provide a multiplicity (array) of the contact force or spring force to create a substantially low insertion force for plugging the removable device into the host device. At the same time, the plurality of spring fingers may provide the multipoint contact conduction cooling of the removable device through the plurality of spring fingers for an effective thermal management of the removable device.

In some examples, the multiplicity of the contact force or spring force exerted by the plurality of spring fingers is within acceptable safety limits to avoid repetitive force (e.g., insertion force or removal force) related injuries. For example, the contact force or the spring force exerted by each spring finger may be in a range from about 0.04 pound-force to 0.08 pound-force. In some examples, each of the plurality of spring fingers may deflect in a range from about 0.5 millimeter to 1.0 millimeter to allow the removable device to be easily plugged into the host device. The plurality of spring fingers may be able to maintain the multipoint contact with the peripheral surface of the removable device, even though the peripheral surface has a non-smooth surface, a non-flat surface, surface imperfections, or debris, because each spring finger may independently generate the optimal spring force to establish the direct thermal interface with a mutually opposite portion of the peripheral surface. Further, since each spring finger uses a substantially small surface area of the dry contact surface for independently exerting the spring force on the peripheral surface, the plurality of spring fingers may further maintain the multipoint contact with the peripheral surface having the aforementioned problems related to the peripheral surface. In some examples, the surface area of the dry contact surface of each spring finger may be in range from about 0.2 square millimeter to 0.6 square millimeter. Further, since the plurality of spring fingers are configured to establish the direct thermal interface with the removable device, the need for a thermal interfacing material (TIM) to establish the thermal interface between the interfacing surfaces, may be avoided.

Accordingly, the usage of the plurality of spring fingers may overcome the aforementioned problems related to the TIM.

Accordingly, in one or more examples of the present disclosure the host device includes a host circuit board having a connector, and a thermal management unit having a cooling component and a plurality of spring fingers. The cooling component is coupled to a portion of the host circuit board, and includes a partially protruded portion. Each of the plurality of spring fingers includes a first end coupled to the partially protruded portion, and a second end having a dry contact surface to establish a direct thermal interface with a peripheral surface of the pluggable removable device to allow waste-heat to transfer from the pluggable removable device to the cooling component through each spring finger.

Figure 1B:
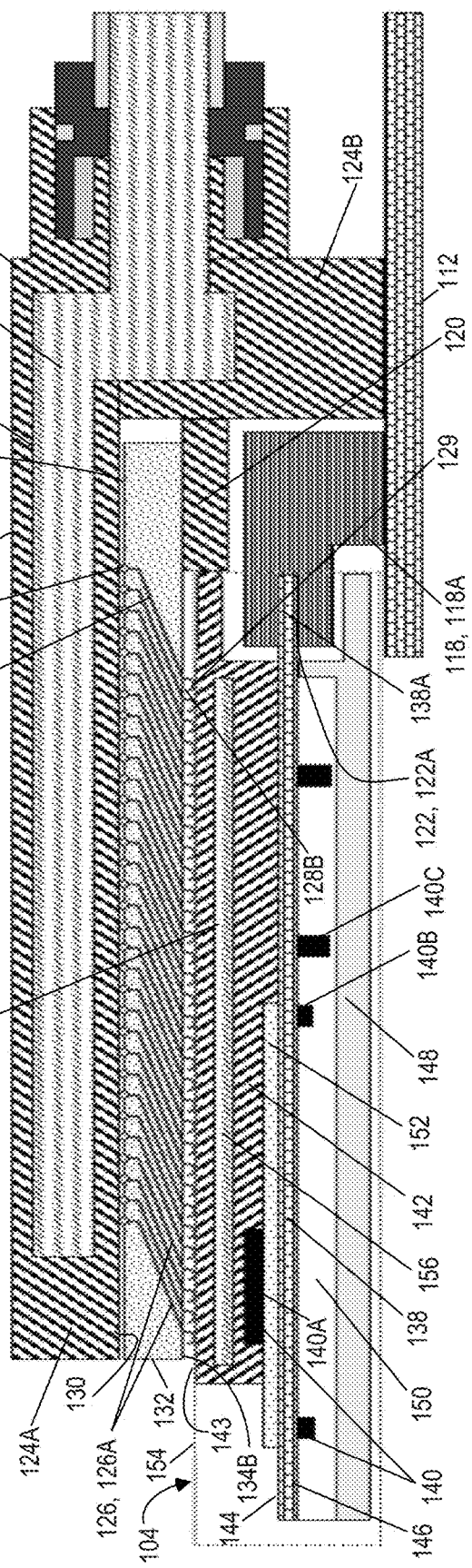
FIG. 1B illustrates a cross-sectional side view of the electronic system taken along line 40-40' in FIG. 1A according to an example implementation of the present disclosure.

FIG. 1A depicts a perspective view of an electronic system 100 having a host device 102 and a removable device 104. FIG. 1B depicts a sectional view of the electronic system 100 taken along line 40-40' in FIG. 1A. In some examples, the electronic system 100 is a compute infrastructure having the host device 102, such as a server device, a storage device, a power conversion device, or a networking device, and a removable device, such as a data communication device, or a storage drive. In the example of FIG. 1A, the host device 102 is the networking device having a switch, and the removable device 104 is the data communication device having a transceiver. In some examples, the switch may be an Ethernet switch and the transceiver may be a small form-factor pluggable (SFP) transceiver coupled to an active optical cable (AOC, not shown) or a Quad small form-factor pluggable (QSFP) transceiver coupled to the AOC.

In some other examples, other types of the host device 102, such as the server device, the storage device, the power conversion device, or the like, may be envisioned without deviating from the scope of the present disclosure. Similarly, other types of the removable device 104, such as the storage drive, for example, NVMe storage drive, or the like may be envisioned without deviating from the scope of the present disclosure.

In one or more examples, the electronic system 100 includes an air containment box 106, which houses the host device 102 and the removable device 104. The box 106 may be an integral part of the compute infrastructure or may be a modular component, which may be attached/coupled to the compute infrastructure. It may be noted herein that in the example of FIG. 1A, only a portion of the compute infrastructure is shown, and such an illustration should not be construed as a limitation of the present disclosure. In particular, the box 106 may include a distal side having an end wall 108 and a front side having an opening 110 to allow insertion of the removable device 104 inside the box 106 and plugging of the removable device 104 into the host device 102.

In some examples, the host device 102 includes a host circuit board 112 and a thermal management unit 114, which are disposed within the box 106. The host circuit board 112 may be a rectangular or square shaped semiconductor component. In such examples, a distal side of the host circuit board 112 may be coupled to the end wall 108 of the box 106, and peripheral sides of the host circuit board 112 may be coupled to peripheral walls 116 of the box 106. In one or more examples, the host circuit board 112 includes a plurality of connectors 118 (or modular ports), which are spaced apart from one another and communicatively coupled to a front side of the host circuit board 112. In some examples, at least one connector, for example, a first connector 118A of the plurality of connectors 118 is an SFP connector or an SFP port. In such examples, the first connector 118A is communicatively coupled to the front portion of the host circuit board 112, as shown in FIG. 1B. In the illustrated example of FIG. 1A, the host circuit board 112 has six connectors 118, which are disposed adjacent to each other. In some examples, each connector of the plurality of connectors 118 is disposed within an electro-magnetic interference (EMI) cage 120 in order to shield from the EMI emissions. Further, each of the plurality of connectors 118 includes a receiver opening 122 facing the opening 110 of the box 106, for receiving the removable device 104 and establishing a communication between the removable device 104 and the host circuit board 112 of the host device 102. In the shown example of FIG. 1B, the first connector 118A includes a first receiver opening 122A for receiving the removable device 104.

The thermal management unit 114 is disposed over the host circuit board 112 and coupled to a portion of the host circuit board 112. In some examples, the thermal management unit 114 includes a cooling component 124 and a plurality of spring fingers 126. In the example of FIGS. 1A and 1B, the cooling component 124 includes a body portion 124B coupled to the portion of the host circuit board 112 and a partially protruded portion 124A that extends outwards relative to the host circuit board 112 from the body portion 124B, and disposed over the connector 118A. In the example of FIG. 1B, the cooling component 124 is a cold plate. In some other examples, the cooling component 124 may be a heat sink. The cooling component 124, such as the cold plate is a liquid-cooling component having a conduit 124C disposed within and attached to an internal channel (not labelled) of the cooling component 124. The thermal management unit 114 may further include a pump (not shown), which is fluidically coupled to the conduit 124C to circulate a coolant liquid 124D for absorbing a waste-heat transferred to the cooling component 124. In some examples, the cooling component 124 and the conduit 124C may include a thermally conductive material, for example, a copper material, an aluminum material, or the like.

In some other non-limiting examples, the partially protruded portion 124A (may also be referred as a "first partially protruded portion") may extend over the host circuit board 112 from the body portion 124B of the cooling component 124, and disposed adjacent to the connector 118A. In other words, the first partially protruded portion 124A may be disposed over another portion of the host circuit board 112 and located between the connector 118A and the body portion 124B of the cooling component 124.

The plurality of spring fingers 126 are spaced apart from each other along a longitudinal direction 10 and a lateral direction 20 of the electronic system 100 to form an array of spring fingers (as shown in 2D, for example). In the example of FIGS. 1A and 1B, each of the plurality of spring fingers 126 has an angled spoon shaped geometry 126A. In some examples, each of the plurality of spring fingers 126A includes a first end 128A, a second end 128B, and a body 126C interconnecting the first and second ends 128A, 128B. In such examples, the second end 128B has a spoon head shaped profile, the first end 128A has a circular profile, and the body 128C has an angled spoon handle shaped profile to define the spring finger 126A having the angled spoon shaped geometry. It may be noted herein that the second end 128B having the spoon head shaped profile may be more clearly evident in the example of FIG. 6. In one or more examples, the first ends 128A of the plurality of spring fingers 126A are spaced apart from one another and coupled to an inner surface 130 of the partially protruded portion 124A. For example, the first end 128A is soldered to the partially protruded portion 124A. In one or more examples, each of the plurality of spring fingers 124A and the soldering may include a thermally conductive material, for example, the copper material, the aluminum material, or the like. Further, the body 128C and the second end 128B of one or more spring fingers 126A may overlay with the body 128C of a mutually adjacent spring finger 126A, thus allowing the thermal management unit to have a substantially high density of the plurality of spring fingers 126A in the array of spring fingers. Further, the second end 128B includes a dry contact surface 129. In some examples, the dry contact surface 129 of the second end 128B may establish a direct thermal interface with the removable device 104. In some examples, the spoon head shaped profile (or the rounded tip of the dry contact surface) of the second end 128B may create a smooth surface for interacting on a mating device (for example, a peripheral surface of the removable device 104) so as to prevent scratching of the interacting surfaces and to prevent damage to the spring finger 126A. The plurality of spring fingers 126A establishing the direct thermal interface with the removable device 104 are discussed in greater details below.

Figure 2D:
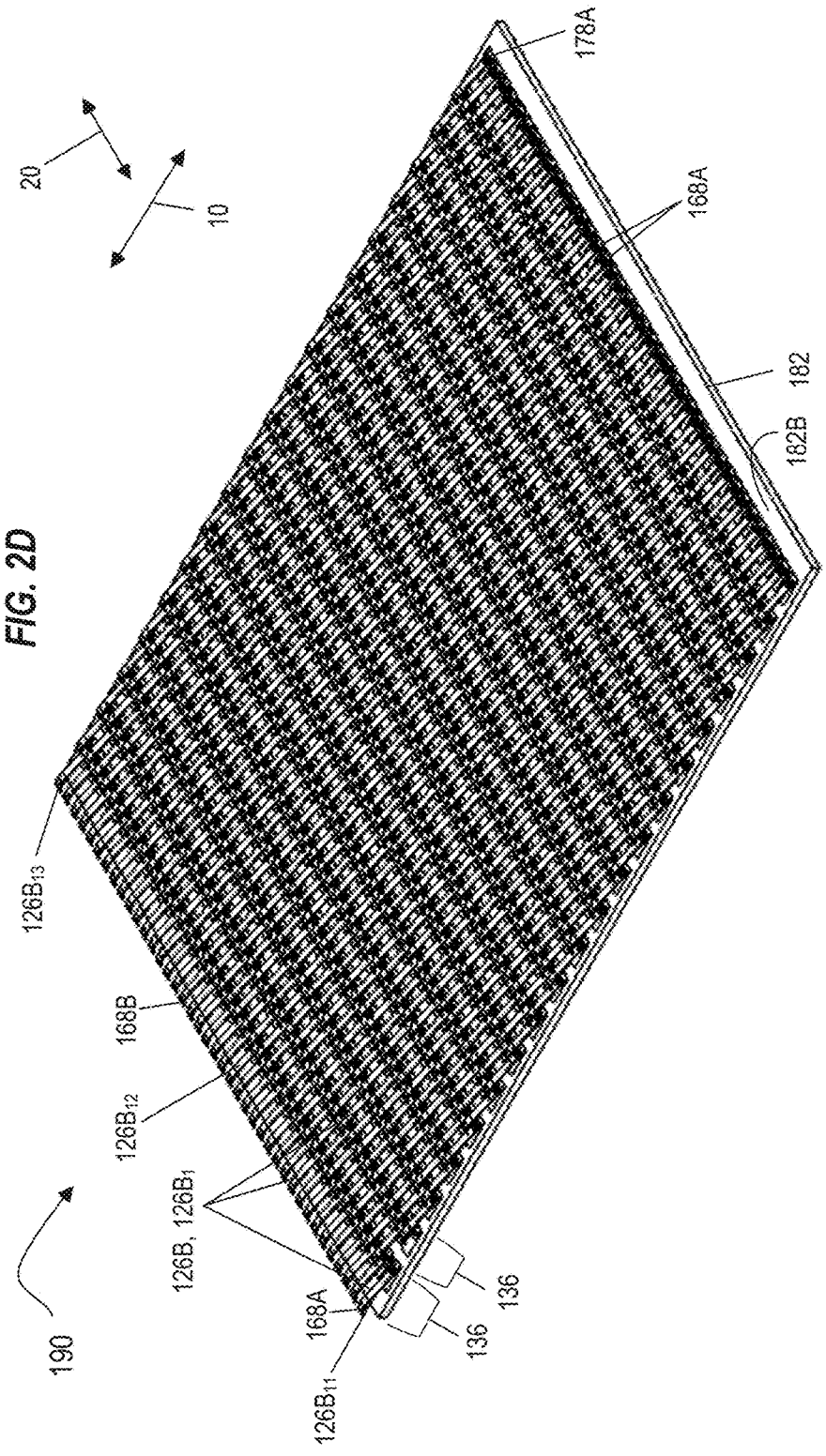
FIG. 2D illustrates a bottom view of an array of spring fingers having a rotated "J" shaped geometry, held by a retainer element according to an example implementation of the present disclosure.

In the example of FIG. 1B, each of the plurality of spring fingers 126A is a discrete component. In some other examples, the plurality of spring fingers 126A may be coupled to each other along the longitudinal direction 10 or the lateral direction 20 to form a plurality of strips (as shown in FIG. 2D, for example). In some examples, the first ends 128A of the plurality of spring fingers 126A may be coupled or merged to each other to form the strip of the plurality of strips.

In some examples, the thermal management unit 114 may further include a retainer element 132 to hold the array of spring fingers together. For example, the plurality of spring fingers 126A in the array are held together by the retainer element 132 such that the first end 128A and the second end 128B of each spring finger 126A protrudes outwards relative to a first peripheral surface 134A and a second peripheral surface 134B respectively, of the retainer element 132. In the example of FIG. 1B, the retainer element 132 may include a plurality of holes (not labeled) to allow each of the plurality of discrete spring fingers 126A to be inserted through a corresponding hole of the plurality of holes to secure each spring finger 126A in the retainer element 132. It may be noted herein, when the plurality of spring fingers 126 are coupled to each other to form the strip, then two or more spring fingers 126 in the strip may be held by the retainer element 132. For example, a first spring finger, a middle spring finger, and the last spring finger (not labeled) in the strip may be held by the retainer element 132. In one or more examples, the retainer element 132 may be made of a polymer material or a thermal conductive material.

The removable device 104 includes a circuit board 138, a plurality of electronic components 140, and a heat spreader 142 disposed within an EMI casing 154 of the removable device 104, such that a peripheral surface 143 of the heat spreader 142 is located at a top portion of the removable device 104. In some examples, the EMI casing 154 may shield the circuit board 138 and the plurality of electronic components from EMI emissions and improve the reliability of the removable device 104.

In some examples, the circuit board 138 may be a rectangular or square shaped double-sided semiconductor component having a top section 144 and a bottom section 146. The circuit board 138 is disposed on peripheral walls (not labeled) of an inner casing 148 such that a gap 150 is formed between the inner casing 148 and the bottom section 146 of the circuit board 138. The plurality of electronic components 140 is coupled to the circuit board 138. In some examples, the plurality of electronic components 140 includes a processor 140A, capacitors 140B, resistors 140C, or the like. In the example of FIG. 1B, the processor 140A is coupled to the top section 144 of the circuit board 138 via an interposer 152. The capacitors 140B and the resistors 140C are directly coupled to the bottom section 146 of the circuit board 138.

In the example of FIG. 1B, the heat spreader 142 is a heat sink having a vapor chamber 156 filled with a coolant liquid 158, disposed within the heat sink. In some examples, the heat spreader 142 is coupled to at least one or more electronic components 140 and the portion of the circuit board 138. In the example of FIG. 1B, the heat spreader 142 is coupled to the processor 140A, the interposer 152, and a portion of the top section 144 of the circuit board 138. The heat spreader 142 is configured to dissipate the waste-heat to the peripheral surface 143. In one or more examples, the heat spreader 142 and the vapor chamber 156 include a thermally conductive material, for example, the copper material, the aluminum material, or the like.

In one or more examples, when the removable device 104 is plugged into the host device 102, the circuit board 138 is communicatively coupled to the host circuit board 112 via the first connector 118A. For example, a portion 138A of the circuit board 138 is inserted into the first receiver opening 122A of the first connector 118A to communicatively couple the circuit board 138 to the host circuit board 112. The heat spreader 142 is disposed below the partially protruded portion 124A. Further, the dry contact surface 129 of each spring finger 126A establishes a direct thermal interface (or contact) with the peripheral surface 143 of the heat spreader 142 to allow the transfer of the waste-heat from the removable device 104 to the cooling component 124 of the host device 102 through each spring finger 126A.

In some other non-limiting examples, when the first partially protruded portion 124A of the cooling component 124 is located between the connector 118A and the body portion 124B of the cooling component 124, the heat spreader 142 may include a second partially protruded portion that may extend outwards relative to the circuit board 138 from a body portion of the heat spreader 142. In particular, the second partially protruded portion may be disposed over the connector 118A and located above the first partially protruded portion 124A of the cooling component 124. In such examples, an inner surface of the second partially protruded portion may define the peripheral surface 143 of the heat spreader 142. Accordingly, in such other non-limiting examples, the dry contact surface 129 of each spring finger 126A may establish the direct thermal interface with the peripheral surface 143 defined by the inner surface of the second partially protruded portion so as to allow the transfer of the waste-heat from the removable device 104 to the cooling component 124 of the host device 102 through each spring finger 126A.

In such other non-limiting examples, the cooling component 124 may further include a third partially protruded portion extending from the body portion 124b of the cooling component 124 and disposed over the second protruded portion of the heat spreader 142. In such examples, an outer surface of the second partially protruded portion may additionally define another peripheral surface of the heat spreader 142. Accordingly, in such other non-limiting examples, the thermal management unit 114 may further include another plurality of spring fingers, which may be coupled to the third partially protruded portion such that a dry contact surface of each of the other spring finger may establish a direct thermal interface with the other peripheral surface defined by the outer surface of the second partially protruded portion so as to allow transfer of additional waste-heat from the removable device 104 to the cooling component 124 of the host device 102 through each of the other spring finger.

In one or more examples, the plurality of spring fingers 126A may be detachably connected to the removable device 104 by allowing each spring finger 126A to operate within a plurality of predefined ranges while maintaining the direct thermal interface (or contact) with the removable device 104. In some examples, the plurality of predefined ranges may include at least one of a spring force or a contact force per a contact point of the dry contact surface 129, a surface area per the contact point of the dry contact surface 129, or a deflection of the second end 1286.

In one or more examples, each spring finger 126A may apply an optimal contact force along a radial direction 30 of the electronic system 100, to allow easy plugging (e.g., inserting or sliding) of the removable device 104 into the host device 102. For example, each spring finger 126A may deflect marginally upwards towards the cooling component 124 (i.e., along the radial direction 30) when the removable device 104 is plugged into the host device 102. However, the optimal spring force exerted by each of the plurality of spring fingers 126A may be sufficient to establish the direct thermal interface between the dry contact surface 129 of each spring finger 126A and the peripheral surface 143 of the removable device 142. In other words, the plurality of spring fingers 126A may provide a multiplicity (array) of the contact force or spring force to create a substantially low insertion force for plugging the removable device 104 into the host device 102. In some examples, the multiplicity of the contact force or spring force exerted by the plurality of spring fingers 126A is within acceptable safety limits to avoid repetitive force (e.g., insertion force or removal force) related injuries. For example, the contact force or the spring force exerted by each spring finger may be in a range from about 0.04 pound-force to 0.08 pound-force. In some examples, each of the plurality of spring fingers 126A may deflect in a range from about 0.5 millimeter to 1.0 millimeter to allow the removable device 104 to be easily plugged into the host device 102.

In one or more examples, the plurality of spring fingers 126A may be able to maintain the multipoint contact (i.e., via the dry contact surface 129) with the peripheral surface 143 of the removable device 104, even though the peripheral surface 143 has a non-smooth surface, a non-flat surface, surface imperfections, or debris, because each spring finger 126A may independently generate the optimal spring force to establish the direct thermal interface with a mutually opposite portion of the peripheral surface 143. Further, each spring finger 126A may use a substantially small surface area of the dry contact surface 129 for independently exerting the spring force on the peripheral surface 143. Therefore, the plurality of spring fingers 126A may be able to further maintain the multipoint contact (i.e., via the dry contact surface 129) with the peripheral surface 143 having the aforementioned problems. In some examples, the surface area of the dry contact surface 129 may be in range from about 0.2 square millimeter to 0.6 square millimeter. Since, the plurality of spring fingers 126A establishes the direct thermal interface with the peripheral surface 143 of the removable device 104, the need for a thermal interfacing material (TIM) to establish the thermal interface (as per a conventional electronic system) between the interfacing surfaces 129, 143, may be avoided. Accordingly, the usage of the plurality of spring fingers 126A may overcome the aforementioned problems related to the TIM.

During operation, the plurality of electronic components 140 of the removable device 104 may transmit, receive, process, or store data. Accordingly, the removable device 104 may consume a greater amount of power, and may thereby produce an increased amount of the waste-heat. In such examples, the heat spreader 142 coupled to the plurality of electronic components 140 and the circuit board 138 may dissipate the waste-heat from those devices 138, 140 towards the peripheral surface 143 of the removable device 104. In some examples, the coolant liquid 158 filled within the vapor chamber 156 may aid in dissipating the waste-heat from the plurality of electronic components 140 and the circuit board 138 to the peripheral surface 143.

The dry contact surface 129 of each spring finger 126, which is in thermal contact with the peripheral surface 143 (i.e., by way of direct thermal interface) of the removable device 104, transfers the dissipated waste-heat from the removable device 104 to the host device 102 via the plurality of spring fingers 126. For example, the waste-heat is transferred from the second end 128B to the first end 128A of each spring finger 126 via the body 128C. Further, the waste-heat is transferred from the first end 128A to the partially protruded portion 124A of the cooling component 124. The coolant liquid 124D flowing in the conduit 124C may absorb the waste-heat from the cooling component 124 and generate heated coolant (not labeled), thereby cooling the cooling component 124. The heated coolant liquid 124B may be pumped outside of the electronic system 100 to exchange the heat with an external coolant (not shown) and regenerate the coolant liquid 124D. Thus, in accordance to one or more examples of the present disclosure, the plurality of spring fingers 126A may provide the multipoint contact conduction cooling of the removable device 104 through the plurality of spring fingers 126A for an effective thermal management of the removable device 104.

In one or more examples, the plurality of spring fingers 126A having the angled spoon handle shaped profile, as discussed hereinabove in the examples of FIGS. 1A-1B may be economical to manufacture. Further, each of the plurality of spring fingers 126A may have a substantially narrow width, thus the thermal management unit 114 may have a high density of the plurality of spring fingers 126A in the array of spring fingers. Further, the spoon head shaped profile (or the rounded tip of the dry contact surface) of each spring finger 126A may create a smooth surface for interacting on the mating device (for example, a peripheral surface of the removable device 104) to prevent scratching of the interacting surfaces and to prevent damage to the spring finger 126A.

FIG. 2A depicts a perspective view of a spring finger 126B having a rotated "J" shaped geometry. In some examples, the spring finger 126B includes a first end 168A, a second end 168B, and a body 168C interconnecting the first and second ends 168A, 168B. For example, the first end 168A is coupled to an end portion 162A of the body 168C via a "C-shaped" connector 168D, and the second end 168B is directly coupled to another end portion 162B of the body 168C to define the spring finger 126B having rotated "J" shaped geometry. In the example of FIG. 2A, the first end 168A and the second end 168B are maintained at different heights by the body 168C. Further, the first end 168A and the second end 168B extend along a same direction relative to corresponding end portions 162A, 162B of the body 168C.

The first ends 168A of the plurality of spring fingers 126B are spaced apart from one another and coupled to the cooling component 124 (as shown in FIG. 1B). In some examples, the first end 168A of each spring finger 126B has a flat surface, which enables the first end 168A to be coupled to the portion of the cooling component 124 via thermally conductive adhesive, such as epoxy material. Further, the second end 168B may have a dry contact surface 168E. In the example of FIG. 2A, the dry contact surface 168E is a flat surface having a surface area in a range from about 0.2 square millimeter to 0.6 square millimeter. In some examples, when the removable device 104 (as shown in FIGS. 1A and 1B) is plugged into the host device 102 (as shown in FIGS. 1A and 1B), the second end 168B may deflect along a radial direction 30 towards the cooling component 124, where the deflection is in a range from about 0.5 millimeter to 1.0 millimeter in order to establish a direct thermal interface (or contact) with a peripheral surface 143 (as shown in FIG. 1B) of the removable device 104.

FIG. 2B depicts a perspective view of another spring finger $126B_1$ having a rotated "J" shaped geometry. In the example of FIG. 2B, the spring finger $126B_1$ includes a first end 178A, a second end 178B, and a body 178C interconnecting the first and second ends 178A, 178B. The second end 178B is substantially similar to the second end 168B of FIG. 2A. Further, the body 178C is substantially similar to the body 168C of FIG. 2A, where the body 178C additionally includes a first cutout 178D. The first end 178A includes a first portion 178F and a second portion 178G coupled to the first portion 178F. In such examples, the first portion 178F has a second cutout 178H, and the second portion 178G is offset radially downwards relatively to the first portion 178F. As discussed in the example of FIG. 2A, the second portion 178G of the first end 178A has a flat surface, which enables the second portion 178G to be coupled to the portion of the cooling component 124 (as shown in FIG. 1B) via the thermally conductive adhesive, such as epoxy material. Further, the second end 178B may have a dry contact surface 178E, as discussed herein above in the example of FIG. 2A.

FIG. 2C depicts a schematic diagram of the spring finger $126B_1$ having the rotated "J" shaped of FIG. 2B and a retainer element 182. In some examples, the retainer element 182 includes a first protrusion 182A, a second protrusion 182B, and a through-hole 182C formed in a body of the retainer element 182. The first and second protrusions 182A, 182B respectively, are formed on a mutually opposite surfaces of the retainer element 182. In some examples, the retainer element 182 is used to securely hold the spring finger $126B_1$. For example, the spring finger $126B_1$ is inserted in the through-hole 182C of the retainer element 182 until the first protrusion 182A snaps into the first cutout 178D (as shown in FIG. 2B) and the second protrusion 182B snaps into the second cutout 178H (as shown in FIG. 2B) of the first end 178A, thereby securely holding the spring finger $126B_1$ to the retainer element 182.

FIG. 2D depicts a bottom view of an array of spring fingers 190 held by a retainer element 182. In some examples, a plurality of spring fingers 126B, $126B_1$ having a rotated "J" shaped geometry are arranged adjacent to one another along a lateral direction 20 and a longitudinal direction 10 to form the array of spring fingers 190. In such examples, the array of spring fingers 190 is held together by the retainer element 182 such that the first ends 168A, 178A and the second ends 168B, 178B of the plurality of spring finger 126B, $126B_1$ respectively, protrudes outwards relative to a first peripheral surface 182A and a second peripheral surface 182B respectively, of the retainer element 182. Further, in the example of FIG. 2D, the plurality of spring fingers 126B, $126B_1$ are coupled to each other along the lateral direction 20 to form a plurality of strips 136. For example, the first ends 168A of the plurality of spring fingers 126B and the first end 178A of the plurality of spring fingers $126B_1$ are coupled to one another to form the plurality of strips 136. In some examples, two or more spring fingers 126B, $126B_1$ in each strip of the plurality of strips 136 are held together by the retainer element 182. For example, the first spring finger $126B_{11}$, the middle spring finger $126B_{12}$, and the last spring finger $126B_{13}$ in each strip 136 are held together by the retainer element 182.

Figure 2E:
FIG. 2E illustrates a side view of a plurality of spring fingers having a rotated "J" shaped geometry according to an example implementation of the present disclosure.

FIG. 2E depicts a side view of the plurality of spring fingers 126B having a rotated "J" shaped geometry arranged adjacent to one another along the longitudinal direction 10. The plurality of spring fingers 126B may be coupled to one another and arranged along the lateral direction 20 to define a plurality of strips 136. As discussed, in the example of FIGS. 2A-2D, each spring finger 126B includes a first end 168A, a second end 168B, and a body 168C interconnecting the first and second ends 168A, 168B to define the spring finger 126B having the rotated "J" shaped geometry. In some examples, the body 168C and the second end 168B of one or more spring fingers 126B may overlay with a portion of the body 168C of a mutually adjacent spring finger 126B, thus allowing the thermal management unit to have a substantially high density of the plurality of spring fingers 126B in the array of spring fingers 190.

In one or more examples, the plurality of spring fingers 126B having the rotated "J" shaped geometry, as discussed hereinabove in the examples of FIGS. 2A-2E maintains an optimal contact force such that each spring finger 126B deflects adequately to allow the removable device 104 to be easily plugged into the host device 102, thus preventing repetitive force related injuries. The plurality of spring fingers 126B having the rotated "J" shaped geometry may additionally have a better stress distribution, when each spring finger 126B deflects to accommodate the removable device 104. Further, the plurality of spring fingers 126B maintains the optimal contact force to establish an adequate direct thermal contact with the peripheral surface 182A of the removable device 104. Additionally, the body 168C and the second end 168B having a narrow width in comparison with a width of the first end 168A may result in a thermal management unit having a substantially high density of the plurality of spring fingers 126B in the array of spring fingers.

FIG. 3A depicts a perspective view of a spring finger 126C having a spatula shaped geometry. In some examples, the spring finger 126C includes a first end 208A, a second end 208B, and a body 208C interconnecting the first and second ends 208A, 208B. For example, the first end 208A having a broad, flat, and blunt shaped profile is coupled to an end portion 202A of the body 208C, and the second end 208B having a narrow and flat shaped profile is coupled to another end portion 202B of the body 208C to define the spring finger 126C having the spatula shaped geometry. In the example of FIG. 3A, the first end 208A and the second end 208B are maintained at different heights by the body 208C. Further, the first end 208A and the second end 208B protrude outwards along mutually opposite directions from corresponding end portions 202A, 202B of the body 208C. The first ends 208A of the plurality of spring fingers 126C are spaced apart from one another and coupled to the cooling component 124 (as shown in FIG. 1B). In some examples, the first end 208A of each spring finger 126C may be coupled to the portion of the cooling component 124 via brazing, for example. Further, the second end 208B may have a dry contact surface 208D. In the example of FIG. 3A, the dry contact surface 208D may have a surface area in a range from about 0.2 square millimeter to 0.6 square millimeter. In some examples, when the removable device 104 (as shown in FIGS. 1A and 1B) is plugged into the host device 102 (as shown in FIGS. 1A and 1B), the second end 208B may deflect along a radial direction 30 towards the cooling component 124, where the deflection is in a range from about 0.5 millimeter to 1.0 millimeter in order to establish a direct thermal interface (or contact) with a peripheral surface 143 (as shown in FIG. 1B) of the removable device 104.

FIG. 3B depicts a bottom view of an array of spring fingers 210. In some examples, a plurality of spring fingers 126C having the spatula shaped geometry are arranged adjacent to one another along a lateral direction 20 and a longitudinal direction 10 to form the array of spring fingers 210. In such examples, the array of spring fingers 210 may be held together by a retainer element (as shown in FIG. 2D). Further, in the example of FIG. 3B, the plurality of spring fingers 126C disposed along the lateral direction 20 are coupled to each other to form a plurality of strips 136A. For example, the first ends 208A of the plurality of spring fingers 126C are coupled to one another to form each of the plurality of strips 136A. In some examples, the body 208C and the second end 208B of one or more spring fingers 126C may overlay with a portion of the body 208C of a mutually adjacent spring finger 126C, thus allowing the thermal management unit to have a substantially high density of the plurality of spring fingers 126C in the array of spring fingers 210.

FIG. 3C depicts a side view of a plurality of spring fingers 126C having the spatula shaped geometry arranged adjacent to one another along the longitudinal direction 10. The plurality of spring fingers 126C may be coupled to one another and arranged along the lateral direction 20 to define a plurality of strips 136A. As discussed, in the example of FIGS. 2A-2D, each spring finger 126C includes a first end 208A, a second end 208B, and a body 208C interconnecting the first and second ends 208A, 208B to define the spring finger 126C having the spatula shaped geometry.

In one or more examples, the plurality of spring fingers 126C having the spatula shaped geometry, as discussed hereinabove in the examples of FIGS. 3A-3C may have a shorter thermal conduction path for transfer of waste-heat between two interfacing surfaces. Further, the first end 208A having a greater width in comparison with the body 208C and the second end 208B, may result in having a greater contact area with the cooling component so that a thermal resistance of the soldered joint or the epoxy joint of the spring finger 126C with the cooling component is substantially less. Further, the plurality of spring fingers 126C having the spatula shaped geometry is economical to manufacture and the spring fingers 126C may have a better stress management as the spring fingers 126C do not have snapping tips.

FIG. 4A depicts a perspective view of a spring finger 126D having a loopback shaped geometry. In some examples, the spring finger 126D includes a first end 218A, a second end 218B, and a body 218C interconnecting the first and second ends 218A, 218B. For example, the first end 218A having a flat shaped profile is coupled to an end portion 212A of the body 218C, and the second end 218B having a "L-shaped" profile is coupled to another end portion 212B of the body 218C to define the spring finger 126D having the loopback shaped geometry. In the example of FIG. 4A, the first end 218A and the second end 218B are maintained at different heights by the body 218C. In some examples, the second end 218B having the "L-shaped" profile includes a first portion 218F, a second portion 218G, and a third portion 218H. In some examples, the first end 218A of each spring finger 126D may be coupled to the portion of the cooling component 124 via one of a thermal conductive adhesive, brazing, or soldering. Further, the intersection region 218E of the first and second portions 218F, 218G of the second end 218B may function as a dry contact surface of the second end 218B. In the example of FIG. 4A, the dry contact surface may have a surface area in a range from about 0.2 square millimeter to 0.6 square millimeter. In some examples, when the removable device 104 (as shown in FIGS. 1A and 1B) is plugged into the host device 102 (as shown in FIGS. 1A and 1B), the second end 218B may deflect along a radial direction 30 towards the cooling component 124 such that the third portion 218H of the second end 218B moves downwards and contacts a portion of the first end 218A to define a short thermal conduction path to the cooling component 124. In such examples, the first portion 218F connected to the dry contact surface 218E and the body 218C may define a long thermal conduction path to the cooling component 124. In some examples, the second end 218B may deflect in a range from about 0.5 millimeter to 1.0 millimeter in order to establish a direct thermal interface (or contact) with a peripheral surface 143 (as shown in FIG. 1B) of the removable device 104.

Figure 4C:
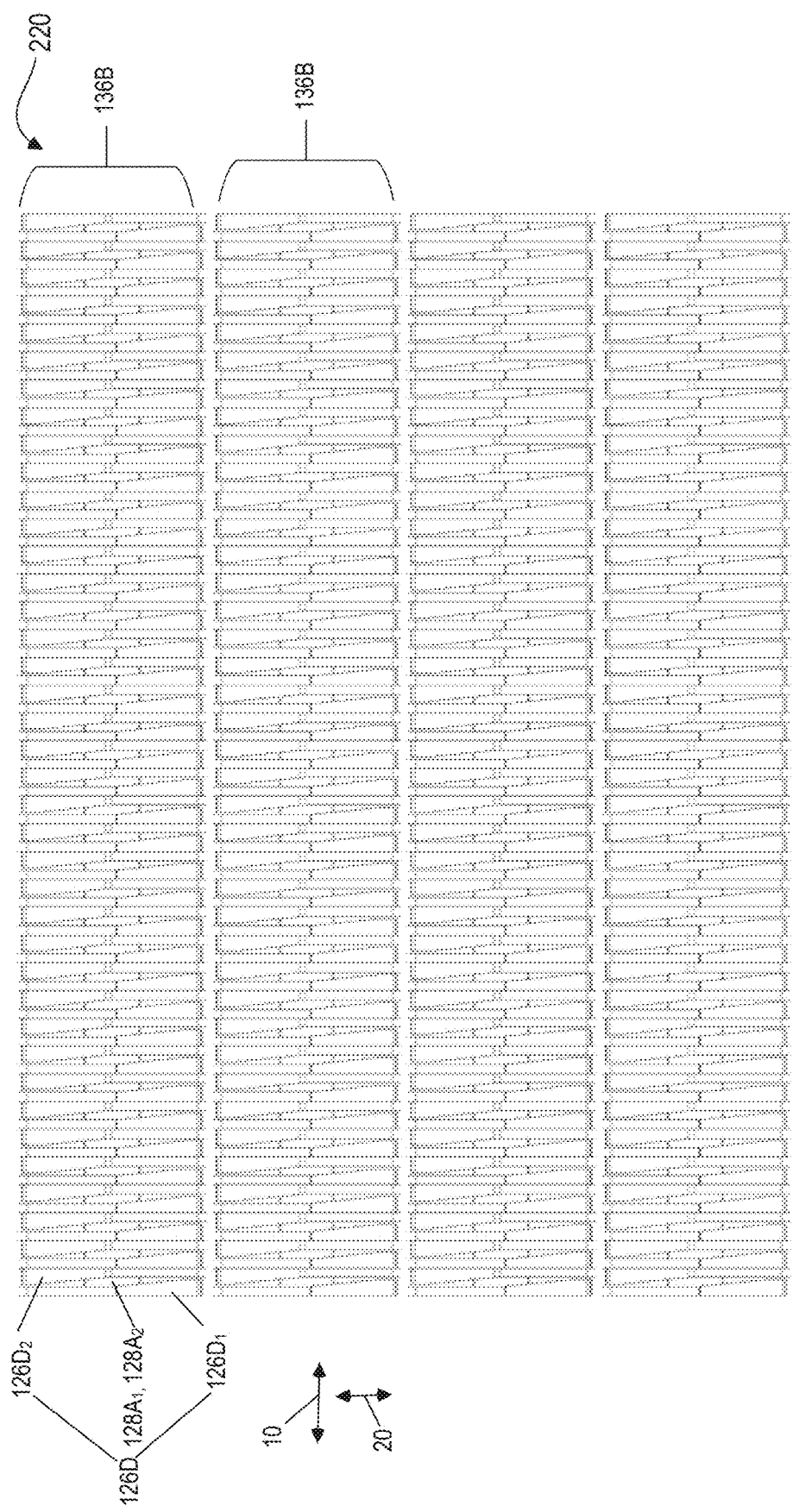
FIG. 4C illustrates a bottom view of an array of spring fingers having a loopback shaped geometry according to an example implementation of the present disclosure.

FIG. 4B depicts a perspective view of the plurality of spring fingers 126D having a loopback shaped geometry. In some examples, the plurality of spring fingers 126D includes plurality of first spring fingers $126D_1$ (as more clearly shown in FIG. 4C) and a plurality of second spring fingers $126D_2$ (as more clearly shown in FIG. 4C) disposed adjacent to each other. In such examples, each first spring finger $126D_1$ has a first end $218A_1$, a second end $218B_1$, and a first body $218C_1$ interconnecting the first and second ends $218A_1$, $218B_1$. Similarly, each second spring finger $126D_2$ has a first end $218A_2$, a second end $218B_2$, and a second body $218C_2$ interconnecting the first and second ends $218A_2$, $218B_2$. In the example of FIG. 4B, the first ends $218A_1$ and $218A_2$ of the first and second spring fingers $126D_1$ and $126D_2$ respectively are coupled to one another. Further, the first body $218C_1$ is oriented in a first direction 40 and the second body $218C_2$ is oriented in a second direction 50 opposite to the first direction 40. In some examples, the first body $218C_1$ and the second body $218C_2$ are arranged to be oriented in opposite directions to balance the load of the cooling component.

FIG. 4C depicts a bottom view of an array of spring fingers 220. In some examples, a plurality of spring fingers 126D includes a plurality of first spring fingers $126D_1$ and a plurality of second spring fingers $126D_2$. In such examples, the plurality of first and second $126D_1$, $126D_2$ having the loopback shaped geometry, as discussed in the example of FIG. 4B, are arranged adjacent to one another along a longitudinal direction 10 and a lateral direction 20 to form the array of spring fingers 220. In some examples, the array of spring fingers 220 may be held together by a retainer element (as shown in FIG. 2D). Further, in the example of FIG. 4C, the plurality of first and second spring fingers $126D_1$, $126D_2$ disposed along the longitudinal direction 10 are coupled to each other to form a plurality of strips 136B. For example, the first end $218A_1$ of each of the plurality of first spring fingers $126D_1$ is coupled to a mutually adjacent first end $218A_2$ of the plurality of second spring fingers $126D_2$ to form the strip of the plurality of strips 136B.

Figure 4D:
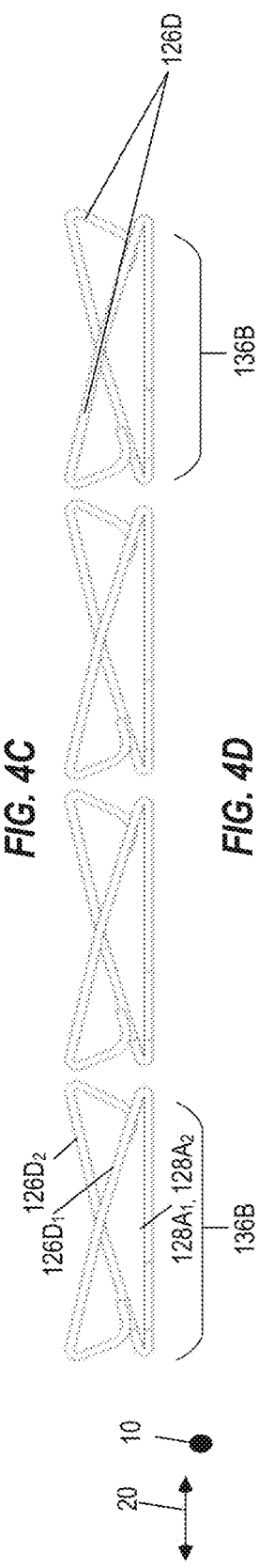
FIG. 4D illustrates a side view of a plurality of spring fingers having a loopback shaped geometry according to an example implementation of the present disclosure.

FIG. 4D depicts a side view of a plurality of spring fingers 126D having the loopback shaped geometry arranged adjacent to one another along the lateral direction 20. The plurality of spring fingers 126D may be coupled to one another and arranged along the longitudinal direction 10 to define a plurality of strips 136B. As discussed, in the example of FIGS. 2A-2D, each spring finger 126D includes a first end 218A, a second end 218B, and a body 218C interconnecting the first and second ends 218A, 218B to define the spring finger 126D having the loopback shaped geometry.

In one or more examples, the plurality of spring fingers 126D having the loopback shaped geometry, as discussed hereinabove in the examples of FIGS. 4A-4D may have a combination of a shorter thermal conduction path and a longer thermal conduction path to transfer the waste-heat between two interfacing surfaces, thereby providing a better thermal management solution to the removable device 104. Further, the plurality of spring fingers 126D maintains an optimal contact force such that each spring finger 126D deflects adequately to allow the removable device 104 to be easily plugged into the host device 102, thus preventing repetitive force related injuries. The plurality of spring fingers 126D having the loopback shaped geometry may additionally have a better stress distribution, when each spring finger 126D deflects to accommodate the removable device 104.

FIG. 5 depicts a perspective view of a spring finger 126E having a cantilever shaped geometry. In some examples, the spring finger 126E includes a first end 248A, a second end 248B, and a body 248C interconnecting the first and second ends 248A, 248B. For example, the first end 248A is coupled to an end portion 242A of the body 248C, and the second end 248B is coupled to another end portion 242B of the body 248C. In the example of FIG. 5, each of the first end 248A, 248B, and the body 248C have substantially same size (e.g., width, thickness) to define the spring finger 126E having the cantilever shaped geometry. Further, the first end 248A and the second end 248B are maintained at different heights by the body 248C. The first end 248A and the second end 248B protrude outwards along mutually opposite directions from corresponding end portions 242A, 242B of the body 248C. In some examples, the first end 248A may be coupled to the portion of the cooling component 124 (as shown in FIG. 1B). Further, the second end 248B may have a dry contact surface 248D. In the example of FIG. 5, the dry contact surface 248D may have a surface area in a range from about 0.2 square millimeter to 0.6 square millimeter. In some examples, when the removable device 104 (as shown in FIGS. 1A and 1B) is plugged into the host device 102 (as shown in FIGS. 1A and 1B), the second end 248B may deflect along a radial direction 30 towards the cooling component 124, where the deflection is in a range from about 0.5 millimeter to 1.0 millimeter in order to establish a direct thermal interface (or contact) with a peripheral surface 143 (as shown in FIG. 1B) of the removable device 104.

In one or more examples, the plurality of spring fingers 126E having the cantilever shaped geometry, as discussed hereinabove in the examples of FIG. 5 may have a shorter thermal conduction path to transfer the waste-heat between two interfacing surfaces. Further, the plurality of spring fingers 126E having the cantilever shaped geometry is economical to manufacture and the spring fingers 126E may have a better stress management as the spring fingers 126E do not have snapping tips.

FIG. 6 depicts a perspective view of a spring finger 126F having a mirrored "S" shaped geometry. In some examples, the spring finger 126F includes a first end 258A, a second end 258B, and a body 258C interconnecting the first and second ends 258A, 258B. For example, the first end 258A is coupled to an end portion 252A of the body 258C, and the second end 258B is coupled to another end portion 252B of the body 258C. In the example of FIG. 6, the first end 258A has a flat shaped profile, the body 248C is oriented at a certain angle relative to the first end 258A, and the second end 258B has an inverted "U-shaped" profile to define the spring finger 126F having the mirrored "S" shaped geometry. Further, the first end 258A and the second end 258B are maintained at different heights by the body 258C. The first end 258A and the second end 258B protrude outwards along mutually opposite directions from corresponding end portions 252A, 252B of the body 258C. In some examples, the first end 258A may be coupled to the portion of the cooling component 124 (as shown in FIG. 1B). Further, the second end 258B may have a dry contact surface 258D. In the example of FIG. 6, the dry contact surface 258D may have a surface area in a range from about 0.2 square millimeter to 0.6 square millimeter. In some examples, when the removable device 104 (as shown in FIGS. 1A and 1B) is plugged into the host device 102 (as shown in FIGS. 1A and 1B), the second end 258B may deflect along a radial direction 30 towards the cooling component 124, where the deflection is in a range from about 0.5 millimeter to 1.0 millimeter in order to establish a direct thermal interface (or contact) with a peripheral surface 143 (as shown in FIG. 1B) of the removable device 104.

In one or more examples, the plurality of spring fingers 126F having the mirrored "S" shaped geometry profile, as discussed hereinabove in the examples of FIG. 6 is economical to manufacture and the thermal management unit 114 may have a substantially high density of the plurality of spring fingers 126A in the array of spring fingers. Further, the spoon head shaped profile (or the rounded tip of the dry contact surface) of each spring finger 126F may create a smooth surface for interacting on the mating device (for example, a peripheral surface of the removable device 104) to prevent scratching of the interacting surfaces and to prevent damage to the spring finger 126F.

FIG. 7A depicts a perspective view of a spring finger 126G having a twin rotated "J" shaped geometry. In some examples, the spring finger 126G includes a first end 268A, a second end 268B, and a body 268C interconnecting the first and second ends 268A, 268B. For example, the first end 268A is coupled to an end portion 262A of the body 268C via a "C-shaped" connector 268D, and the second end 268B is directly coupled to another end portion 262B of the body 268C to define the spring finger 126G having the twin rotated "J" shaped geometry. In the example of FIG. 7A, the first end 268A and the second end 268B are maintained at different heights by the body 268C. Further, the second end 268B has a "C-shaped" profile, and the first end 268A has a flat profile. In the example of FIG. 7A, the first end 268A and the second end 268B protrude inwards along mutually opposite directions relative to corresponding end portions 262A, 262B of the body 268C. Further, the first end 268A and the body 268C has an extended through opening 266A, 266C respectively to form two legs of the first end 268A and the body 268C, and thereby defining the twin rotated "J" shaped profile for the spring finger 126G. The first end 268A of each of the plurality of spring fingers 126G are spaced apart from one another and coupled to the cooling component 124 (as shown in FIG. 7B). As discussed hereinabove, the first end 268A of each spring finger 126G has a flat profile, which enables the first end 268A to be coupled to the portion of the cooling component 124 via thermally conductive adhesive, such as epoxy material. Further, the second end 268B may have a dry contact surface 268E. For example, an intersection portion of the "C-shaped" profile with the other end portion 262B of the body 268C may define a dry contact surface 268E of the spring finger 126G. In the example of FIG. 7A, the dry contact surface 268E may have a surface area in a range from about 0.2 square millimeter to 0.6 square millimeter. In some examples, when the removable device 104 (as shown in FIGS. 1A and 1B) is plugged into the host device 102 (as shown in FIGS. 1A and 1B), the second end 268B may deflect along a radial direction 30 towards the cooling component 124, where the deflection is in a range from about 0.5 millimeter to 1.0 millimeter in order to establish a direct thermal interface (or contact) with a peripheral surface 143 (as shown in FIG. 1B) of the removable device 104.

FIG. 7B depicts a perspective view of a strip 136C of a plurality of spring fingers 126G having a twin rotated "J" shaped geometry. In the example of FIG. 7B, the plurality of spring fingers 126G are disposed adjacent to one another along a lateral direction 20. Further, the first end 268A and the "C-shaped" connector 268D of each of the plurality of spring fingers 126G are coupled to one another to form the strip 136C.

FIG. 7C depicts a bottom view of an array of spring fingers 290. In some examples, a plurality of spring fingers 126G having a twin rotated "J" shaped geometry are arranged adjacent to one another along a lateral direction 20 and a longitudinal direction 10 to form the array of spring fingers 290. Further, in the example of FIG. 7C, the plurality of spring fingers 126B are coupled to each other along the lateral direction 20 to form a plurality of strips 136C. In some examples, the second end 268B of each of the plurality of spring fingers 126G in one strip 136C$_2$ protrudes into the extended through openings 266C in the body 268C of each of the plurality of spring fingers 126G in a mutually adjacent strip 136C$_1$, when the removable device 104 (as shown in FIG. 1B) is plugged into the host device 102. In other words, the extended through openings 266C in the body 268C of the spring fingers 126G in the strip 136C$_1$ creates clearance for the second end 268B of the spring fingers 126G in the adjacent strip 136C$_2$ for interleaving of the spring fingers 126G in the strip 136C$_1$. Thus, the interleaving functionality of the spring fingers 126G allows the plurality of strips 136C to be placed closer together, and thereby increase a density of the spring fingers 126G per square inch of the cooling component 104 (as shown in FIG. 1B). Further, the second end 268B having the "C-shaped" profile may enable more surface area for contacting with the removable device 104, thereby providing substantially better mechanics for waster-heat transfer between the two interfacing surfaces.

FIG. 7D depicts a side view of the plurality of spring fingers 126G having a twin rotated "J" shaped geometry arranged adjacent to one another along the longitudinal direction 10. The plurality of spring fingers 126G may be coupled to one another and arranged along the lateral direction 20 to define a plurality of strips 136C. As discussed, in the example of FIGS. 7A-7C, each spring finger 126G includes a first end 268A, a second end 268B, and a body 268C interconnecting the first and second ends 268A, 268B. Further, the first end 268A and the body 268C includes extended through openings 266A, 266C respectively, to define the spring finger 126G having the twin rotated "J" shaped geometry. In some examples, the second end 268B of each of the plurality of spring fingers 126G in the strip 136C$_2$ may interleave with the plurality of spring fingers 126G in a mutually adjacent strip 136C$_1$, thus allowing the thermal management unit to have a substantially high density of the plurality of spring fingers 126B in the array of spring fingers 290.

As discussed hereinabove with reference to embodiments of FIG. 2D, for example, an array of spring fingers may include a plurality of strips, where each strip may have a plurality of spring fingers having a particular shaped geometry. In such examples, a first strip of the plurality of strips may include the plurality of spring fingers 128B having a rotated "J" shaped geometry. The second strip may include the plurality of spring fingers 128C having a spatula shaped geometry. The third strip may have the plurality of spring fingers 128D having a loopback shaped geometry. The fourth strip may have the plurality of spring fingers 128A having an angled spoon shaped geometry. The fifth strip may have the plurality of spring fingers 128E having a cantilever shaped geometry. The sixth strip may have the plurality of spring fingers 128F having a mirrored "S" shaped geometry. The seventh strip may have the plurality of spring fingers 128G having a twin rotated "J" shaped geometry.

FIG. 8 is a flow diagram depicting a method 800 of a thermal management of a removable device. It should be noted herein that the method 800 is described in conjunction with FIGS. 1A and 1B, for example.

The method 800 starts at block 802 and continues to block 804. At block 804, the method 800 includes plugging the removable device into a host device to communicatively couple a circuit board of the removable device to a host circuit board of the host device through a connector, as described in FIGS. 1A and 1B. In some examples, a portion of the circuit board is inserted into an opening of the connector to communicatively couple the circuit board to the host circuit board.

Further, the method 800 continues to block 806. At block 806, the method 800 includes the step of establishing a direct thermal contact between a dry contact surface of each spring finger and a peripheral surface of the removable device by deflecting a second end of each spring finger towards a cooling component of the host device and exerting a spring force on the peripheral surface. In some examples, each spring finger may deflect marginally upwards towards the cooling component (i.e., along the radial direction) when the removable device is plugged into the host device. However, the optimal spring force exerted by each of the plurality of spring fingers may be sufficient to establish the direct thermal interface between the dry contact surface of each spring finger and the peripheral surface of the removable device. The plurality of spring fingers may provide a multiplicity (array) of the contact force or spring force to create a substantially low insertion force for plugging the removable device into the host device. At the same time, the optimal spring force exerted by each of the plurality of spring fingers may be sufficient to establish the direct thermal interface between the dry contact surface of each spring finger and the peripheral surface of the removable device.

At block 808, the method 800 includes dissipating a waste-heat generated by the removable device to the peripheral surface. In some examples, the removable device may convert electrical signals into optical signals or vice versa for transmitting or receiving data through an interconnecting cable. In some other examples, the removable device may store and process the data. Accordingly, the removable device may consume a greater amount of power, and may thereby produce an increased amount of the waste-heat. In such examples, the removable circuit board may dissipate the waste-heat from devices which generate the waste-heat towards the peripheral surface of the removable device.

At block 810, the method includes transferring the waste-heat from the removable device to the cooling component via the plurality of spring fingers. In some examples, the dry contact surface of each spring finger, which is in thermal contact with the peripheral surface (i.e., by way of direct thermal interface) of the removable device, transfers the dissipated waste-heat from the peripheral surface of the removable device to the host device via the plurality of spring fingers. For example, the waste-heat is transferred from the second end to a first end of each spring finger via a body of each spring finger.

In some examples, the waste-heat is further transferred from the first end to a partially protruded portion of the cooling component. In such examples, a coolant liquid flowing in a conduit of the cooling component may absorb the waste-heat from the cooling component and generate heated coolant, thereby cooling the cooling component. In one or more examples, the heated coolant liquid may be pumped outside of an electronic system to exchange the heat with an external coolant and regenerate the coolant liquid. Thus, in accordance to one or more examples of the present disclosure, the plurality of spring fingers may provide the multipoint contact conduction cooling of the removable device through the plurality of spring fingers for an effective thermal management of the removable device. The method 800 ends at block 812.

Various features as illustrated in the examples described herein may be implemented in a system, such as a host device and method for a thermal management of a removable device. In one or more examples, the array of spring fingers maintains an optimal contact force while plugging the removable device into the host device, which is within acceptable safety limits to avoid repetitive force (e.g., insertion force or removal force) related injuries. Further, the plurality of spring fingers may be able to maintain the multipoint contact (i.e., via the dry contact surface) with the peripheral surface of the removable device, even though the peripheral surface has a non-smooth surface, a non-flat surface, surface imperfections, or debris, because each spring finger may independently generate the optimal spring force to establish the direct thermal interface with a mutually opposite portion of the peripheral surface. Further, each spring finger may use a substantially small surface area of the dry contact surface for independently exerting the spring force on the peripheral surface. Hence, the plurality of spring fingers may be able to further maintain the multipoint contact (i.e., via the dry contact surface) with the peripheral surface having the aforementioned problems. Since, the plurality of spring fingers establishes the direct thermal interface with the peripheral surface of the removable device, the need for a thermal interfacing material (TIM) to establish the thermal interface (as per a conventional electronic system) between the interfacing surfaces may be avoided.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A host device comprising:
   a host circuit board having a connector; and
   a thermal management unit comprising:
      a cooling component coupled to a portion of the host circuit board, wherein the cooling component comprises a partially protruded portion; and
      a plurality of spring fingers spaced apart from each other, wherein each of the plurality of spring fingers comprises a first end coupled to the partially protruded portion, and a second end having a dry contact surface to establish a direct thermal interface with a peripheral surface of a removable device to allow a waste-heat to transfer from the removable device to the cooling component through each spring finger, wherein the plurality of spring fingers are arranged adjacent to one another along a lateral direction and a longitudinal direction to form an array of spring fingers, and wherein the array of spring fingers are held together by a retainer element such that the first end and the second end of each spring finger protrudes outwards relative to a first peripheral surface and a second peripheral surface, respectively, of the retainer element.

2. The host device of claim 1, wherein the plurality of spring fingers comprises at least one of a rotated "J" shaped geometry, a spatula shaped geometry, a loopback shaped geometry, an angled spoon shaped geometry, a cantilever shaped geometry, a mirrored "S" shaped geometry, or a twin rotated "J" shaped geometry.

3. The host device of claim 1, wherein each of the plurality of spring fingers in the array of spring fingers is a discrete component.

4. The host device of claim 1, wherein the plurality of spring fingers are coupled to each other to form a plurality of strips along the lateral direction or the longitudinal direction, wherein two or more spring fingers in each strip of the plurality of strips are held by the retainer element, and wherein each of the plurality of spring fingers in at least one strip of the plurality of strips comprises a rotated "J" shaped geometry, a spatula shaped geometry, a loopback shaped geometry, an angled spoon shaped geometry, a cantilever shaped geometry, a mirrored "S" shaped geometry, or a twin rotated "J" shaped geometry.

5. The host device of claim 1, wherein each spring finger further comprises a body interconnecting the first and second ends, wherein the body and the second end of one or more spring fingers overlay with a portion of the body of a mutually adjacent spring finger, to allow the thermal management unit to have a substantially high density of the plurality of spring fingers in the array of spring fingers.

6. The host device of claim 1, wherein the first end of each spring finger is coupled to the partially protruded portion using at least one of a thermally conductive adhesive, soldering, or brazing.

7. The host device of claim 1, wherein the cooling component is one of a heat sink or a cold plate.

8. The host device of claim 1, wherein the plurality of spring fingers comprises a plurality of first spring fingers and a plurality of second spring fingers disposed adjacent to each other, wherein each first spring finger has a first end, a second end, and a first body interconnecting the first and second ends, wherein each second spring finger has a first end, a second end, and a second body interconnecting the first and second ends, and wherein the first body is oriented in a first direction and the second body is oriented in a second direction opposite to the first direction.

9. An electronic system comprising:
a host device comprising a thermal management unit and a host circuit board having a connector, wherein the thermal management unit comprises:
  a cooling component coupled to a portion of the host circuit board, wherein the cooling component comprises a partially protruded portion; and
  a plurality of spring fingers spaced apart from each other, wherein each of the plurality of spring fingers comprises a first end coupled to the partially protruded portion, and a second end having a dry contact surface, wherein the plurality of spring fingers are arranged adjacent to one another along a lateral direction and a longitudinal direction to form an array of spring fingers, and wherein the array of spring fingers are held together by a retainer element such that the first end and the second end of each spring finger protrudes outwards relative to a first peripheral surface and a second peripheral surface, respectively, of the retainer element; and
a removable device comprising:
  a circuit board communicatively coupled to the host circuit board via the connector;
  a plurality of electronic components coupled to a portion of the circuit board, wherein the circuit board and the plurality of electronic components generates a waste-heat; and
  a heat spreader coupled to at least one or more electronic components and the portion of the circuit board, wherein the heat spreader dissipates the waste-heat to a peripheral surface of the heat spreader, and
wherein the dry contact surface establishes a direct thermal interface with the peripheral surface to transfer the waste-heat from the removable device to the cooling component through each spring finger.

10. The electronic system of claim 9, wherein the plurality of spring fingers comprises at least one of a rotated "J" shaped geometry, a spatula shaped geometry, a loopback shaped geometry, an angled spoon shaped geometry, a cantilever shaped geometry, a mirrored "S" shaped geometry, or a twin rotated "J" shaped geometry.

11. The electronic system of claim 9, wherein each of the plurality of spring fingers in the array of spring fingers is a discrete component.

12. The electronic system of claim 9, wherein the plurality of spring fingers are coupled to each other to form a plurality of strips along the lateral direction or the longitudinal direction, and wherein two or more spring fingers in each strip of the plurality of strips are held by the retainer element, and wherein each of the plurality of spring fingers in at least one strip of the plurality of strips comprises a rotated "J" shaped geometry, a spatula shaped geometry, a loopback shaped geometry, an angled spoon shaped geometry, a cantilever shaped geometry, a mirrored "S" shaped geometry, or a twin rotated "J" shaped geometry.

13. The electronic system of claim 9, wherein the plurality of spring fingers is detachably connected to the removable device by allowing each spring finger to operate within a plurality of predefined ranges while maintaining the direct thermal interface with the removable device,
wherein the plurality of predefined ranges comprises at least one of a spring force per a contact point of the dry contact surface, a surface area per the contact point of the dry contact surface, or a deflection of the second end,
wherein the spring force of each spring finger is in a range from about 0.04 pound-force to 0.08 pound-force, wherein the surface area of each spring finger is in a range from about 0.2 square millimeter to 0.6 square millimeter, and wherein the deflection of each spring finger is in a range from about 0.5 millimeter to 1.0 millimeter.

14. The electronic system of claim 9, wherein the removable device is a pluggable electronic device comprising a small form-factor pluggable (SFP) transceiver having an active optical cable (AOC).

15. The electronic system of claim 9, wherein each spring finger further comprises a body interconnecting the first and second ends, wherein the body and the second end of one or more spring fingers overlay with a portion of the body of a mutually adjacent spring finger, to allow the thermal management unit to have a substantially high density of the plurality of spring fingers in the array of spring fingers.

16. The electronic system of claim 9, wherein the first end of each spring finger is coupled to the partially protruded portion using at least one of a thermally conductive adhesive, soldering, or brazing.

17. The electronic system of claim 9, wherein the cooling component is one of a heat sink or a cold plate.

18. The electronic system of claim 9, wherein the plurality of spring fingers comprises a plurality of first spring fingers and a plurality of second spring fingers disposed adjacent to each other, wherein each first spring finger has a first end, a second end, and a first body interconnecting the first and second ends, wherein each second spring finger has a first end, a second end, and a second body interconnecting the first and second ends, and wherein the first body is oriented in a first direction and the second body is oriented in a second direction opposite to the first direction.

19. A method comprising:
plugging a removable device into a host device to communicatively couple a circuit board of the removable device to a host circuit board of the host device through a connector,
  wherein the host device comprises a thermal management unit having a plurality of spring fingers, and a cooling component coupled to a portion of the host circuit board, wherein the cooling component comprises a partially protruded portion, wherein each spring finger comprises a first end coupled to the partially protruded portion, and a second end having a dry contact surface, wherein the plurality of spring fingers are arranged adjacent to one another along a lateral direction and a longitudinal direction to form an array of spring fingers, and wherein the array of spring fingers are held together by a retainer element such that the first end and the second end of each spring finger protrudes outwards relative to a first peripheral surface and a second peripheral surface, respectively, of the retainer element, and wherein the removable device comprises a heat spreader coupled to the removable circuit board to dissipate waste-heat to a peripheral surface of the heat spreader;
establishing a direct thermal interface between the dry contact surface and the peripheral surface by deflecting the second end of each spring finger towards the cooling component and exerting a spring force on the peripheral surface;
dissipating the waste-heat generated by the removable device to the peripheral surface; and transferring the waste-heat from the removable device to the cooling component via the plurality of spring fingers.

20. The method of claim 19, wherein plugging the removable device into the host device comprises applying an insertion force to marginally overpower the spring force applied by the plurality of spring fingers.

* * * * *